(12) United States Patent
Yamazaki et al.

(10) Patent No.: US 7,057,209 B2
(45) Date of Patent: *Jun. 6, 2006

(54) LIGHT EMITTING DEVICE, METHOD OF MANUFACTURING THE SAME AND MANUFACTURING APPARATUS THEREFOR

(75) Inventors: Shunpei Yamazaki, Tokyo (JP); Toshiji Hamatani, Kanagawa (JP); Toru Takayama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/963,370

(22) Filed: Oct. 12, 2004

(65) Prior Publication Data

US 2005/0045917 A1    Mar. 3, 2005

Related U.S. Application Data

(63) Continuation of application No. 10/317,615, filed on Dec. 12, 2002, now Pat. No. 6,815,723.

(30) Foreign Application Priority Data

Dec. 28, 2001    (JP)    ............................. 2001-401687

(51) Int. Cl.
*H01L 27/15*    (2006.01)
*H01L 33/00*    (2006.01)

(52) U.S. Cl. ............................. 257/88; 257/40; 257/83; 257/84; 257/89; 313/503; 313/504; 438/22; 438/24

(58) Field of Classification Search .................. 257/40, 257/59, 72, 83, 84, 88, 89, 98, 99; 438/22, 438/24; 313/503–506
See application file for complete search history.

(56) References Cited

U.S. PATENT DOCUMENTS

| 4,871,236 A | 10/1989 | Gemma et al. ............. 350/355 |
| 4,971,919 A | 11/1990 | Yamazaki ....................... 437/2 |
| 5,478,777 A | 12/1995 | Yamazaki .................... 437/173 |
| 5,677,546 A | 10/1997 | Yu ................................ 257/40 |
| 5,682,043 A | 10/1997 | Pei et al. ....................... 257/40 |
| 5,970,318 A | 10/1999 | Choi et al. .................... 438/99 |
| 6,013,384 A | 1/2000 | Kido et al. .................. 428/690 |
| 6,066,518 A * | 5/2000 | Yamazaki .................... 438/166 |
| 6,107,734 A | 8/2000 | Tanaka et al. ............... 313/506 |
| 6,198,091 B1 | 3/2001 | Forrest et al. ............. 250/214.1 |
| 6,198,092 B1 | 3/2001 | Bulovic et al. ........... 250/214.1 |
| 6,278,055 B1 | 8/2001 | Forrest et al. .............. 136/263 |
| 6,297,495 B1 | 10/2001 | Bulovic et al. .......... 250/214.1 |
| 6,352,777 B1 | 3/2002 | Bulovic et al. .......... 428/411.1 |
| 6,423,429 B1 | 7/2002 | Kido et al. .................. 428/690 |
| 6,451,415 B1 | 9/2002 | Forrest et al. .............. 428/212 |

(Continued)

FOREIGN PATENT DOCUMENTS

EP    0 215 683 B1    3/1987

(Continued)

*Primary Examiner*—Donghee Kang
(74) *Attorney, Agent, or Firm*—Cook, Alex, McFarron, Manzo, Cummings & Mehler, Ltd.

(57) ABSTRACT

A light emitting device having high definition, a high aperture ratio, and high reliability is provided. The present invention achieves high definition and a high aperture ratio with a full color flat panel display using red, green, and blue color emission light by intentionally forming laminate portions, wherein portions of different organic compound layers of adjacent light emitting elements overlap with each other, without depending upon the method of forming the organic compound layers or the film formation precision.

14 Claims, 10 Drawing Sheets

U.S. PATENT DOCUMENTS

| | | | |
|---|---|---|---|
| 6,452,092 B1 | 9/2002 | Han et al. | 136/263 |
| 6,524,884 B1 | 2/2003 | Kim et al. | 438/99 |
| 6,580,213 B1 | 6/2003 | Yamazaki | 313/506 |
| 6,593,691 B1 | 7/2003 | Nishi et al. | 313/506 |
| 6,692,820 B1 | 2/2004 | Forrest et al. | 428/212 |
| 6,815,723 B1 * | 11/2004 | Yamazaki et al. | 257/88 |
| 6,844,025 B1 | 1/2005 | Forrest et al. | 427/74 |
| 2001/0031509 A1 | 10/2001 | Yamazaki | 438/48 |
| 2001/0046611 A1 | 11/2001 | Kido et al. | 428/690 |
| 2002/0021268 A1 | 2/2002 | Yamazaki et al. | 345/80 |
| 2002/0057055 A1 | 5/2002 | Yamazaki et al. | 313/506 |
| 2002/0119297 A1 | 8/2002 | Forrest et al. | 428/199 |
| 2002/0189666 A1 | 12/2002 | Forrest et al. | 136/263 |
| 2002/0197462 A1 | 12/2002 | Forrest et al. | 428/212 |
| 2003/0042846 A1 | 3/2003 | Forrest et al. | 313/503 |
| 2003/0183830 A1 | 10/2003 | Yamazaki et al. | 257/90 |
| 2003/0209974 A1 | 11/2003 | Yamazaki | 313/504 |
| 2003/0218166 A1 | 11/2003 | Tsutsui | 257/40 |
| 2004/0027059 A1 | 2/2004 | Tsutsui | 313/504 |
| 2004/0027061 A1 | 2/2004 | Seo et al. | 313/504 |
| 2004/0113546 A1 | 6/2004 | Forrest et al. | 313/504 |
| 2004/0151887 A1 | 8/2004 | Forrest et al. | 428/212 |

FOREIGN PATENT DOCUMENTS

| | | |
|---|---|---|
| EP | 0 855 848 | 7/1998 |
| EP | 0 948 063 | 10/1999 |
| JP | 60-028278 | 2/1985 |
| JP | 04-192376 | 7/1992 |
| JP | 06-318725 | 11/1994 |
| JP | 10-189252 | 7/1998 |
| JP | 10-270171 | 10/1998 |
| JP | 11-251067 | 9/1999 |
| JP | 11-329748 | 11/1999 |
| JP | 2001-291592 | 10/2001 |
| JP | 2001-357975 | 12/2001 |
| JP | 2002-164170 | 6/2002 |
| JP | 2003-045676 | 2/2003 |
| JP | 2003-515933 | 5/2003 |
| WO | WO 02/101838 | 12/2002 |

* cited by examiner light emitting layer: 2layers light emitting layer: 2layers light emitting layer: 1layer
(example for comparing)

● : light emitting layer: 1layer
(example for comparing)

□ : light emitting layer: 2layers

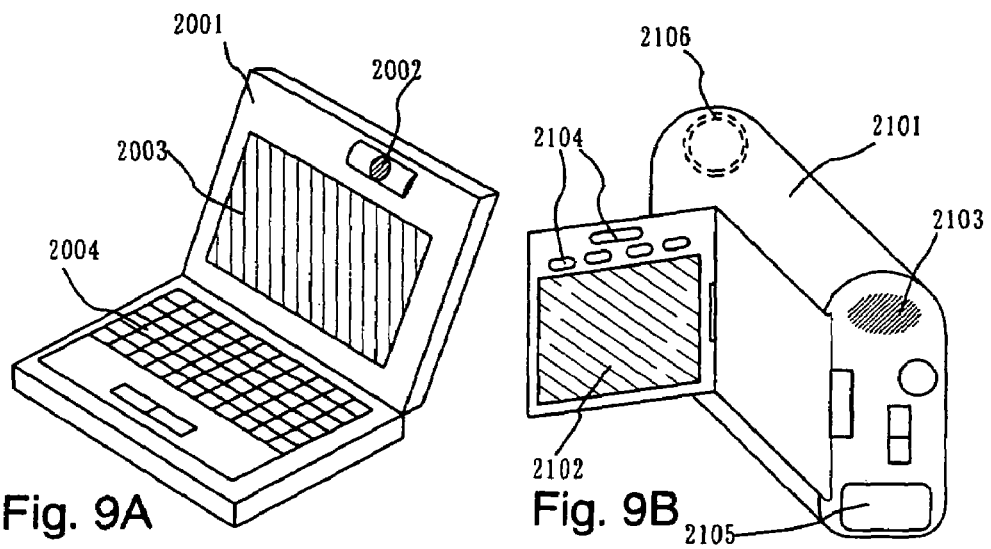
Fig. 9A  Fig. 9B
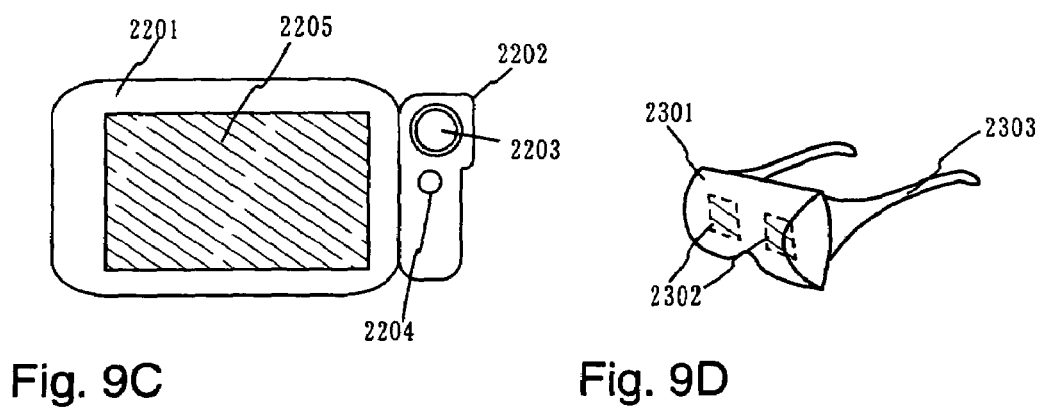
Fig. 9C  Fig. 9D
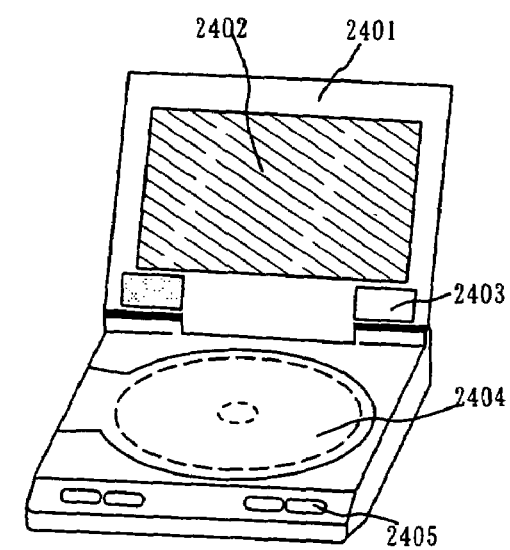
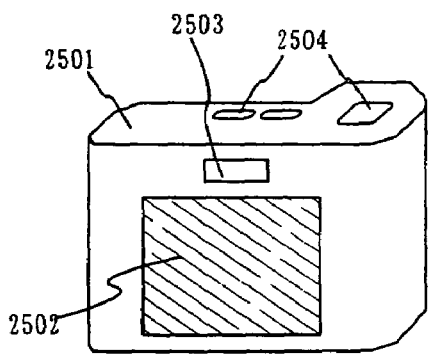
Fig. 9E  Fig. 9F

LIGHT EMITTING DEVICE, METHOD OF MANUFACTURING THE SAME AND MANUFACTURING APPARATUS THEREFOR

This application is a continuation of U.S. application Ser. No. 10/317,615, filed on Dec. 12, 2002 now U.S. Pat. No. 6,815,723.

BACKGROUND OF THE INVENTION

1. Field of the Invention

The present invention relates to a semiconductor device, in particular, the present invention relates to an organic light emitting device (OLED) having a light emitting element formed on a substrate having an insulating surface. Further, the present invention relates to an organic light emitting module on which ICs and the like, including a controller, are mounted to an organic light emitting panel. Note that the terms organic light emitting panel and organic light emitting module both refer to light emitting devices in this specification. The present invention additionally relates to an apparatus for manufacturing the light emitting device.

In this specification, semiconductor devices correspond to general devices functioning by use of semiconductor characteristics. Therefore, a light emitting device, an electro-optical device, a semiconductor circuit and an electronic device are all included in the category of the semiconductor device.

2. Description of the Related Art

Techniques of forming TFTs (thin film transistors) on substrates have been progressing greatly in recent years, and developments in their application to active matrix display devices is advancing. In particular, TFTs that use polysilicon films have a higher electric field effect mobility (also referred to as mobility) than TFTs that use conventional amorphous silicon films, and therefore high speed operation is possible. Developments in performing control of pixels by forming driver circuits made from TFTs that use polysilicon films on a substrate on which the pixels are formed have therefore been flourishing. It has been expected that various advantages can be obtained by using active matrix display devices in which pixels and driver circuits are mounted on the same substrate, such as reductions in manufacturing cost, miniaturization of the display device, increases in yield, and increases in throughput.

Furthermore, research on active matrix light emitting devices using organic light emitting elements as self light emitting elements (hereinafter referred to simply as light emitting devices) has become more active. The light emitting devices are also referred to as organic EL displays (OELDs) and organic light emitting diodes (OLEDs).

TFT switching elements (hereinafter referred to as switching elements) are formed for each pixel in active matrix light emitting devices, and driver elements for performing electric current control using the switching TFTs (hereinafter referred to as electric current control TFTs) are operated, thus making EL layers (strictly speaking, light emitting layers) emit light. For example, a light emitting device disclosed in JP 10-189252 A is known.

Organic light emitting elements are self light emitting, and therefore have high visibility. Backlights, necessary for liquid crystal display devices (LCDs), are not required for organic light emitting elements, which are optimal for making display devices thinner and have no limitations in viewing angle. Light emitting devices using organic light emitting elements are consequently being focused upon as substitutes for CRTs and LCDs.

Note that EL elements have a layer containing an organic compound in which luminescence develops by the addition of an electric field (electroluminescence) (hereinafter referred to as EL layer), an anode, and a cathode. There is light emission when returning to a base state from a singlet excitation state (fluorescence), and light emission when returning to a base state from a triplet excitation state (phosphorescence) in the organic compound layer, and it is possible to apply both types of light emission to light emitting devices manufactured by the manufacturing apparatus and film formation method of the present invention.

EL elements have a structure in which an EL layer is sandwiched between a pair of electrodes, and the EL layer normally has a laminate structure. A "hole transporting layer/light emitting layer/electron transporting layer" laminate structure proposed by Tang et al. of Eastman Kodak Co. can be given as a typical example. This structure has extremely high light emitting efficiency, and at present almost all light emitting devices undergoing research and development employ this structure.

Further, a structure in which: a hole injecting layer, a hole transporting layer, a light emitting layer, and an electron transporting layer are laminated in order on an anode; or a hole injecting layer, a hole transporting layer, a light emitting layer, an electron transporting layer, and an electron injecting layer are laminated in order on an anode may also be used. Fluorescent pigments and the like may also be doped into the light emitting layers. Further, all of the layers may be formed by using low molecular weight materials, and all of the layers may be formed by using high molecular weight materials. The layers may also include inorganic materials such as silicon.

Note that all layers formed between a cathode and an anode are referred to generically as EL layers in this specification. The aforementioned hole injecting layer, hole transporting layer, light emitting layer, electron transporting layer, and electron injecting layer are therefore all included in the category of EL layers.

Both low molecular weight organic compound materials and high molecular weight (polymer) organic compound materials are undergoing research as organic compound materials for EL layers (strictly speaking light emitting layers) which can be regarded as a main EL element.

Ink jet methods, evaporation, and spin coating are known as methods for forming films of these organic materials.

However, with these methods the film formation precision is not very high. Wide gaps are therefore designed between different pixels, and insulators referred to as banks are formed between pixels, when considering the manufacture of full color, flat panel displays using red, green, and blue colors of light emission.

Further, the demands for high definition, high aperture ratio, and high reliability are increased for full color flat panel displays using red, green, and blue color light emission. These demands become a big problem, however, in that the pitch between pixels becomes finer along with making the light emitting device higher in definition (increasing the number of pixels) and reducing the size of the light emitting device. Furthermore, the demands for increases in productivity and reductions in cost also increase.

SUMMARY OF THE INVENTION

An object of the present invention is therefore to achieve high definition, and a high aperture ratio, in a full color flat panel display using red, green, and blue color light emission, without depending on the organic compound layer film formation method or the film formation precision, by intentionally making a portion of different organic compound layers of adjacent light emitting elements overlap with each other.

Note that, although the luminance of light emission in the portions wherein parts of different organic compound layers overlap with each other falls to approximately 0.1% of its normal value, and the amount of electric current flowing there also drops to 0.1% of its normal value, it is possible to have light emission of an order capable of being sufficiently recognized, provided that a high voltage (equal to or greater than approximately 9 V) is applied.

According to a structure 1 of the present invention disclosed in this specification, there is provided a light emitting device comprising a plurality of light emitting elements, each having a cathode, an organic compound layer contacting the cathode, and an anode contacting the organic compound layer, in which one light emitting element has: a first light emitting region structured by the cathode, the organic compound layer contacting the cathode, and the anode contacting the organic compound layer; and a second light emitting region structured by the cathode, a laminate organic compound layer contacting the cathode, and the anode contacting the laminate organic compound layer.

In the above-mentioned structure 1, the laminate organic compound layer is a laminate layer of: the organic compound layer in the first light emitting region; and an organic compound layer of a light emitting element adjacent to the one light emitting element and having a different color light emission therefrom.

Further, three types of light emitting elements are suitably disposed for full color RGB, and according to a structure 2 of the present invention disclosed in this specification, there is provided a light emitting device comprising a plurality of light emitting elements, each having a cathode, an organic compound layer contacting the cathode, and an anode contacting the organic compound layer, in which a first light emitting element having a first organic compound layer, a second light emitting element having a second organic compound layer, and a third light emitting element having a third organic compound layer are arranged, and a portion of the first organic compound layer and a portion of the second organic compound layer overlap with each other in the first light emitting element.

Also, according to a structure 3 of the present invention disclosed in this specification, there is provided a light emitting device comprising a plurality of light emitting elements, each having a cathode, an organic compound layer contacting the cathode, and an anode contacting the organic compound layer, in which: a first light emitting element having a first light emitting layer, a second light emitting element having a second light emitting layer, and a third light emitting element having a third light emitting layer are arranged; a portion of the first organic compound layer and a portion of the second organic compound layer overlap with each other in the first light emitting element; and a portion of the second organic compound layer and a portion of the third organic compound layer overlap with each other in the second light emitting element.

Also, in the above-mentioned structure 2 or 3, the first light emitting element emits light of one color selected from the group consisting of red, green, and blue. Also, the first light emitting element, the second light emitting element, and the third light emitting element each emit light having a mutually different color.

Further, it is preferable to tightly seal the entire light emitting element using a sealing substrate, for example a glass substrate or a plastic substrate, during sealing in the structures 1, 2, and 3.

There is a problem with light emitting devices in that external light (light from outside of the light emitting device) made incident to pixels which are not emitting light is reflected by rear surfaces of the cathodes (surfaces contacting the light emitting layer), and the rear surfaces of the cathodes act as a mirror, reflecting external scenery in observation surfaces (surfaces toward an observer). Further, although circularly polarizing films are bonded to the observation surfaces of the light emitting device in order to avoid this problem, the circularly polarizing films have an extremely high cost, and this is a problem in that it invites an increase in manufacturing costs.

An object of the present invention is therefore to prevent turning the light emitting device into a mirrored surface without using a circularly polarizing film, and to provide a low cost light emitting device in which manufacturing costs for the light emitting device are thus lower. Low cost color filters are used by the present invention as a substitute for the circularly polarizing films. It is preferable to provide color filters in the light emitting device for each of the structures 1, 2, and 3 corresponding to each of the pixels in order to increase color purity. Furthermore, black color filter portions (black color organic resins) may also be formed overlapping the portions located between the light emitting regions. In addition, the black color filter portions may also overlap with the portions in which parts of different organic compound layers overlap with each other.

Note that the color filters are formed in the emission direction of the emitted light, that is between the light emitting elements and the observer. For example, color filters may be bonded to the sealing substrate for cases in which light does not pass through the substrate on which the light emitting elements are formed. Alternatively, color filters may be formed on the light emitting element substrate if light passes through the light emitting element substrate. Circularly polarizing films thus become unnecessary.

Further, the biggest problem in putting EL elements to practical use is that the element lifetime is insufficient. Element degradation also becomes a large problem as EL layer degradation occurs with the appearance of dark spots spreading along with long time light emission.

To solve this problem, the present invention employs a structure covered with a protective film made from a silicon nitride film or a silicon oxynitride film in which a silicon oxide film or a silicon oxynitride film is formed as a buffer layer in order to relieve stress in the protective film.

According to a structure 4 of the present invention, there is provided a light emitting device comprising a plurality of light emitting elements, each having a cathode, a an organic compound layer contacting the cathode, and an anode contacting the organic compound layer, in which: the anode is made from a transparent conductive film; and the anode is covered with a laminate of a buffer layer and a protective film.

In the above-mentioned structure 4, the buffer layer may be an insulating film having as its main constituent silicon oxide or silicon oxynitride formed by sputtering (RF sputtering or DC sputtering) or by a remote plasma method, and the protective film may be an insulating film having silicon nitride or silicon oxynitride as its main constituent formed by sputtering.

In addition, the aforementioned structure 4 is extremely useful for cases in which a transparent conductive film (typically ITO) is used as a cathode or an anode and a protective film is formed thereon. Note that, although there is a danger that impurities contained in the transparent conductive film (such as In, Sn, and Zn) will mix into a silicon nitride film contacting the transparent conductive film if the silicon nitride film is formed by sputtering, the impurities can be prevented from mixing into the silicon nitride film by forming the buffer layer of the present invention between the two films. The mixing in of impurities (such as In and Sn) form the transparent conductive film can be prevented by forming the buffer layer in accordance with the structure 4, and a superior protective film having no impurities can be formed.

Further, it is preferable to use different chambers for the buffer layer and the protective film in a method of manufacturing for achieving the structure 4. A structure relating to a method of manufacturing of the present invention is a method of manufacturing a light emitting device having a plurality of light emitting elements, each light emitting element having a cathode, an organic compound layer contacting the cathode, and an anode contacting the organic compound layer. After forming the anode from a transparent conductive film and the buffer layer covering the anode using the same chamber, the protective film is formed on the buffer layer using a different chamber.

Further, structures with two different light emission directions can be considered for an active matrix light emitting device. One is a structure in which light emitted from an EL element passes through an opposing substrate and out to enter the eye of an observer. The observer can recognize an image from the opposing substrate side in this case. The other structure is one in which light emitted form an EL element passes through an element substrate and out to enter the eye of an observer. In this case the observer can recognize an image from the element substrate side.

The present invention provides a manufacturing apparatus capable of making both of these structures.

A structure 5 of the present invention according to the present invention relates to a manufacturing apparatus including: a loading chamber; a first conveyor chamber coupled to the loading chamber; an organic compound layer film formation chamber coupled to the first conveyor chamber; a second conveyor chamber coupled to the first conveyor chamber; a metallic layer film formation chamber coupled to the second conveyor chamber; a transparent conductive film formation chamber; a protective film formation chamber; a third conveyor chamber coupled to the second conveyor chamber; a dispenser chamber coupled to the third conveyor chamber; a sealing substrate loading chamber; and a sealing chamber.

In the above-mentioned structure 5, the transparent conductive film formation chamber is provided with a plurality of targets including at least a target made from a transparent conductive material and a target made from silicon. Also, in the above-mentioned structure 5, the transparent conductive film formation chamber is provided with an apparatus for forming a film by a remote plasma method.

Further, a substrate on which a drying agent is bonded is placed in the sealing substrate loading chamber in the structure 5. In addition, there is a vacuum exhaust system in the sealing substrate loading chamber.

Further, there are also vacuum exhaust systems in the first conveyor chamber, the second conveyor chamber, the third conveyor chamber, and the sealing chamber.

Furthermore, the structure 4, in which the buffer layer and the protective film are formed, can be manufactured with good throughput by using the manufacturing apparatus shown in the structure 5.

BRIEF DESCRIPTION OF THE DRAWINGS

In the accompanying drawings:
FIGS. 9A to 9F are diagrams showing examples of electronic equipment.

DETAILED DESCRIPTION OF THE PREFERRED EMBODIMENT MODES

Embodiment modes of the present invention are explained below.

Embodiment Mode 1

The present invention is explained below by an example of a 3×3 section of pixels from among many pixels disposed regularly in a pixel portion.

Figure 1A:
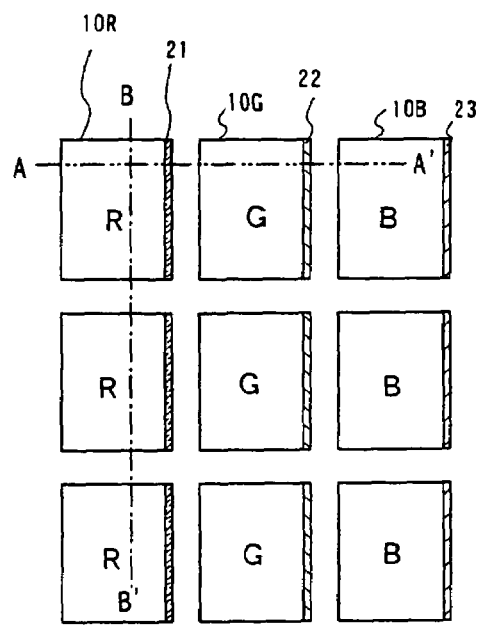
FIGS. 1A to 1C are a top view and cross sectional views, respectively, of pixels (3×3)

FIG. 1A is a top view. In FIG. 1A, a light emitting region 10R is a red color light emitting region, a light emitting region 10G is a green color light emitting region, and a light emitting region 10B is a blue color light emitting region. A full color light emitting device is achieved by the light emitting regions of the three colors.

Figure 1B:
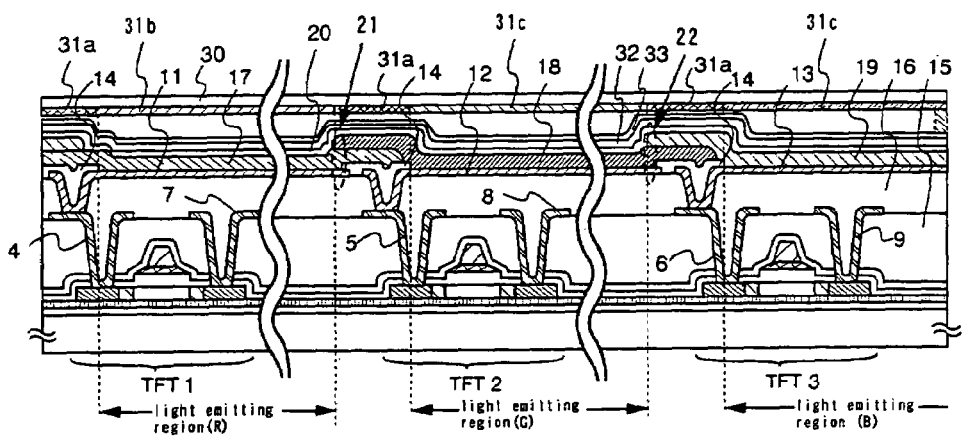
Figure 1C:
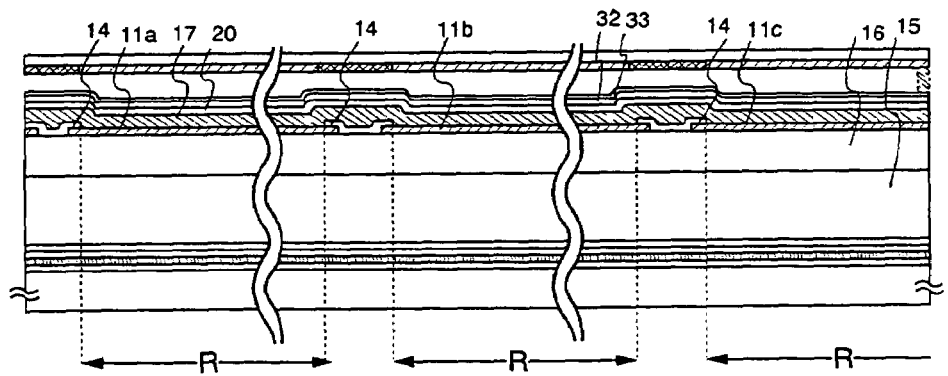

Further, FIG. 1B is a cross sectional view of FIG. 1A sectioned along a dashed line segment A–A'. In the present invention, a portion of a red color light emitting EL layer 17 (for example, an EL layer in which Nile Red, a red color luminescent pigment is added to $Alq_3$) overlaps with a portion of a green color light emitting element 18 (for example, an EL layer in which DMQd (dimethyl quinacridone) is added to $Alq_3$), forming a laminate portion 21, as shown in FIG. 1B. Further, a portion of the green color light emitting EL layer 18 overlaps with a portion of a blue color light emitting EL 19 (for example, an EL layer in which perylene is added to BAlq), forming a laminate portion 22. Note that although an example in which only one side (right side edge portion) of the light emitting regions is overlapped is shown in FIGS. 1A to 1C, there are no limitations placed on which portions are to be overlapped, provided that a part of a circumferential portion is overlapped. Both edges, an upper side edge, or a lower side edge may also be overlapped.

A structure in which portions of the EL layers may overlap with each other is used, and therefore high definition and a high aperture ratio can be achieved with a full color flat panel display using red, green, and blue color light emission without depending on the method employed in forming the organic compound layers (such as ink jet printing, evaporation, or spin coating), or on the film formation precision.

Further, a TFT 1 in FIG. 1B is an element for controlling the amount of electric current flowing in the red color light emitting EL layer 17 (p-channel TFT or n-channel TFT), and reference numeral 4 denotes one of a source electrode and a drain electrode, and reference numeral 7 denotes the other of them. Further, a TFT 12 is an element for controlling the amount of electric current flowing in the green color light emitting EL layer 18, reference numeral 5 denotes one of a source electrode and a drain electrode, and reference numeral 8 denotes the other of them. A TFT 3 is an element for controlling the amount of electric current flowing in the blue color light emitting EL layer 19, reference numeral 6 denotes one of a source electrode and a drain electrode, and reference numeral 9 denotes the other of them. Reference numerals 15 and 16 denote interlayer insulating films made from an organic insulating material or an inorganic insulating material.

Further, reference numerals 11 to 13 denote organic light emitting element cathodes (or anodes), and reference numeral 20 denotes an organic light emitting element anode (or cathode). It is preferable that p-channel TFTs be used if the electrodes 11 to 13 are anodes, and it is preferable that n-channel TFTs be used if the electrodes 11 to 13 are cathodes. A material having a small work function (Al, Ag, Li, Ca, or their alloys MgAg, MgIn, AlLi, $CaF_2$, or CaN) may be used if the electrodes 11 to 13 are cathodes. Further, a material selected form the group consisting of Ti, TiN, $TiSi_xN_y$, Ni, W, $WSi_x$, $WN_x$, $WSi_xN_y$, NbN, Mo, Cr, Pt, Zn, Sn, and In, an alloy material having one of the aforementioned materials as its main constituent, a film having a compound of these materials as its main constituent, or a laminate film of such films may be used if the electrodes 11 to 13 are anodes. Both edge portions of the electrodes 11 to 13 and portions between the edge portions are covered with inorganic insulators 14. The electrodes 11 to 13 are formed of Cr as cathodes here. The electrode 20 is formed, as an anode, of a transparent conductive film having a high work function (ITO (indium tin oxide alloy), an alloy of indium oxide and zinc oxide ($In_2O_3$—ZnO), zinc oxide (ZnO) or the like). Light emitted from each light emitting element passes through the anode 20. Further, a laminate film of a metallic thin film through which light passes (such as MgAg, MgIn, or AlLi) and a transparent conductive film may also be used if the electrodes 11 to 13 are anodes and the electrode 20 is a cathode.

A sealing substrate 30 is then bonded by using a sealing material (not shown in the figures) so as to maintain a spacing of approximately 10 μm, thus sealing all light emitting elements. In addition, color filters are formed on the sealing substrate 30, corresponding to each pixel, in order to increase color purity. A red colorization layer 31b is formed opposing the red color light emitting region 10R, a green colorization layer 31c is formed opposing the green color light emitting region 10G, and a blue colorization layer 31d is formed opposing the blue color light emitting region 10B. Further, regions outside of the light emitting regions are shaded by black color portions of the color filters, namely shading portions 31a. Note that the shading portions 31a are structured by a metallic film (chrome or the like) or an organic material film containing a black color pigment.

Circularly polarizing plates are unnecessary in the present invention because the color filters are formed.

FIG. 1C is a cross sectional view for cases in which FIG. 1A is cut along a dashed line segment B–B'. Edge portions denoted by reference numerals 11a to 11c and portions between the edge portions are also covered with the inorganic insulators 14 in FIG. 1C. An example is shown here in which the red color light emitting EL layer 17 is common, but the present invention is not limited by this, and the EL layer may also be formed for each pixels that emits the same color of light.

An experiment was performed for comparing the relationship between the voltage applied to the light emitting regions 10R, 10G, and 10B, and the luminance of light emitted by the light emitting regions, and the relationship between the voltage applied to the laminate portions 21 to 23 and the luminance of light emitted by these portions. The experimental results are shown in FIG. 2D.

Figure 2A:
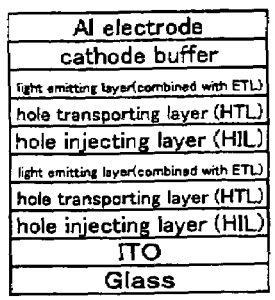
FIGS. 2A to 2D are graphs showing the relationship between luminance and voltage.
Figure 2B:
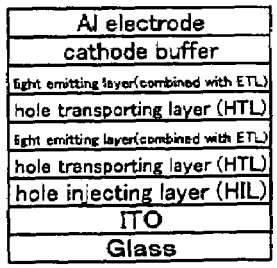
Figure 2C:
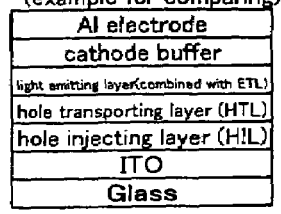
Figure 2D:
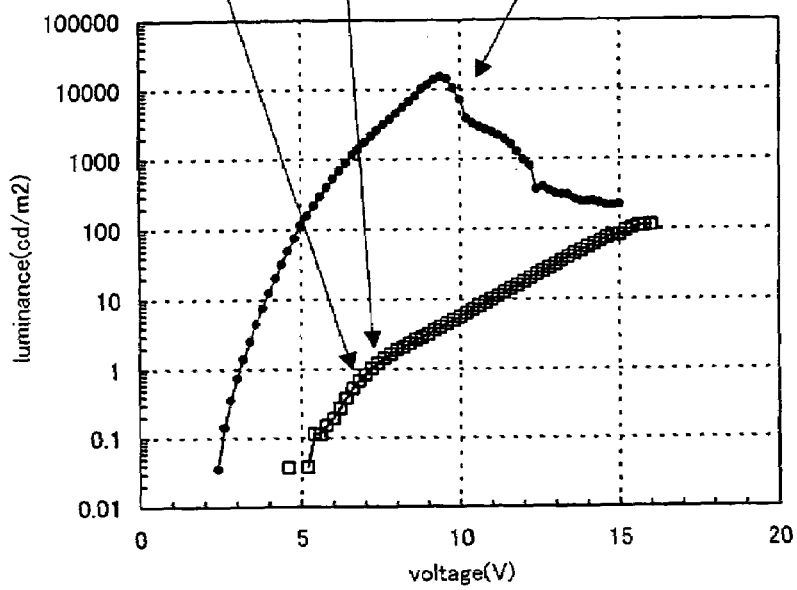

The FIG. 2D is a graph showing the relationship between voltage (V) on the horizontal axis and luminance ($cd/m^2$) on the vertical axis. Data shown by circular marks within FIG. 2D denotes the relationship between the voltage and luminance of light emitting elements structured by three layers, an anode, an organic light emitting layer, and a cathode. Further, data shown by rectangular marks denotes the relationship between voltage and luminance of light emitting elements structured by four layers, an anode, a first organic light emitting layer, a second organic light emitting layer, and a cathode. The organic light emitting layers are structured by a laminate of a light emitting layer, a hole transporting layer (HTL) and a hole injecting layer (HIL). In other words, the data shown by the rectangular marks in FIG. 2D is a graph of the relationship between voltage and luminance of light emitting elements having a laminate structure shown in FIG. 2A. That is, a laminate of an anode, a first organic light emitting layer (a first light emitting layer, a first hole transporting layer, and a first hole injecting layer), a second organic light emitting layer (a second light emitting layer, a second hole transporting layer, and a second hole injecting layer), and a cathode.

As shown in FIG. 2D, the luminance of light emitted from the light emitting elements having the four layer structure of the anode, the two organic light emitting layers, and the cathode falls by approximately four orders of magnitude compared to the luminance of light emitted form the light emitting elements having the three layer structure of the anode, the organic light emitting layer, and the cathode. It can be anticipated that this is due to a reverse direction diode being formed when the two organic light emitting layers overlap with each other, wherein it becomes more difficult for electric current to flow. Further, the film thickness becomes thicker, and therefore it can be anticipated that the electrical resistance becomes large and it becomes more difficult for electric current to flow.

Considering how these results correspond to FIGS. 1A to 1C, the luminance of light emitted by the light emitting regions 10R, 10G, and 10B can be considered to be the luminance of the laminate structure shown in FIG. 2C, and the luminance of light emitted by the laminate portions 21 to 23 can be considered to be the luminance of the laminate structure shown in FIG. 2A. The luminance of light emitted by the laminate portions 21 to 23 therefore is approximately one one-thousandth that of the luminance of light emitted by the light emitting regions 10R, 10G, and 10B.

Further, among the organic light emitting layers, at least one layer is used in common, for example the hole injecting layer, and a portion of the first organic light emitting layer and a portion of the second organic light emitting layer may overlap with each other on the hole injecting layer. Results similar to those of the laminate structure shown in FIG. 2A are also obtained for the laminate structure shown in FIG. 2B in which the hole injecting layer is common, that is when the relationship between voltage and luminance of light emitting elements having a laminate structure of an anode, a first organic light emitting layer (a first light emitting layer and a first hole transporting layer), a second organic light emitting layer (a second light emitting layer, a second hole transporting layer, and the first hole injecting layer), and a cathode.

Figure 3A:
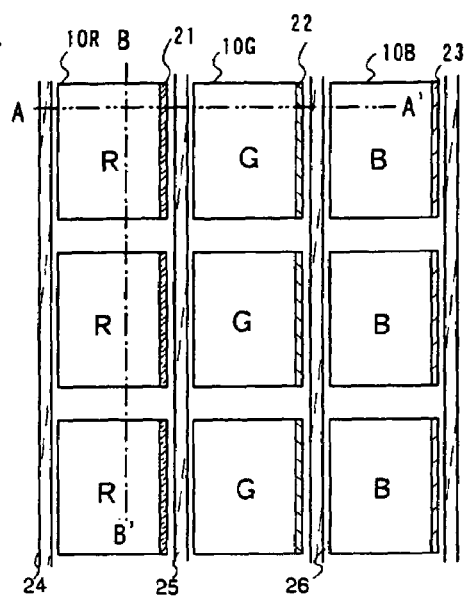
FIGS. 3A to 3C are a top view and cross sectional views, respectively, of pixels (3×3)
Figure 3B:
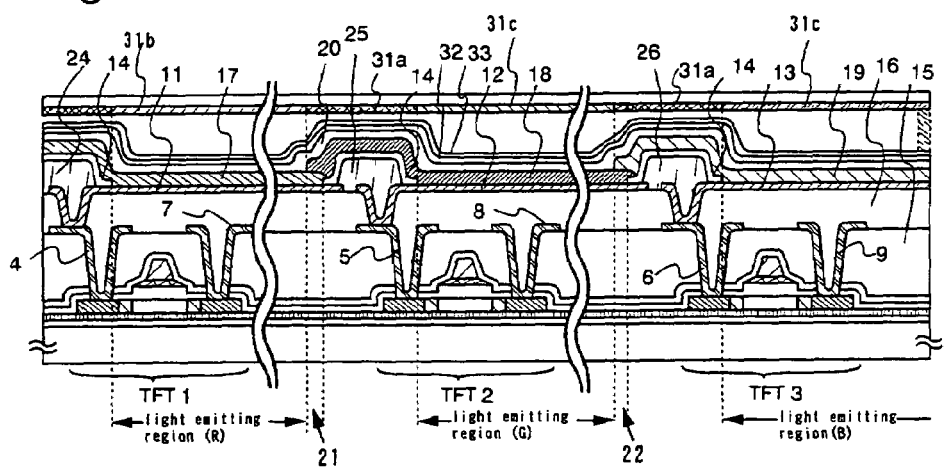
Figure 3C:
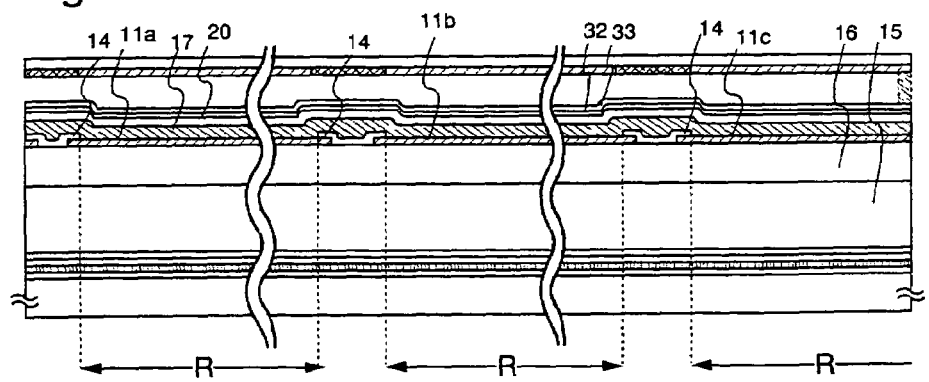

Further, an example having a structure that partially differs from that of FIGS. 1A to 1C is shown in FIGS. 3A to 3C. Note that portions in FIGS. 3A to 3C that are identical to those of FIGS. 1A to 1C use identical reference numerals for simplicity.

As shown in FIG. 3A, this is an example in which banks 25 made from an organic resin are formed between the light emitting region 10R and the light emitting region 10G, and between the light emitting region 10G and the light emitting region 10B. Although it depends on patterning precision, it inevitably becomes difficult to make the distance between the light emitting region 10G and the light emitting region 10B narrower if the banks 25 are formed. In many cases the banks are formed around each of the pixels, but FIGS. 3A to 3C employ a structure in which the banks are formed for every column of pixels.

Banks are not formed in FIGS. 1A to 1C, and therefore the spacing between each of the light emitting regions can be made narrow, and a high definition light emitting device can be achieved.

Further, a protective film 33 is formed in order to increase reliability in FIGS. 1A to 1C and in FIGS. 3A to 3C. The protective film 33 is an insulating film having silicon nitride or silicon oxynitride as its main constituent. A buffer layer 32 is formed before forming the protective film in order to relieve stresses within the protective film 33. The buffer layer 32 may be formed by an insulating film having silicon oxide or silicon oxynitride as its main constituent with use of a DC sputtering apparatus, an RF sputtering apparatus, or an apparatus using a remote plasma method. Further, emitted light passes through the protective film in FIGS. 1A to 1C and FIGS. 3A to 3C, and therefore it is preferable that the film thickness of the protective film be as thin as possible.

There is a risk that impurities contained in a transparent conductive film (In, Sn, Zn, and the like) will mix into the protective film 33 if the transparent conductive film (typically ITO) is used as a cathode or an anode in FIGS. 1A to 1C and FIGS. 3A to 3C, and if the protective film 33 is formed so as to contact the transparent conductive film. Forming the buffer layer 32 between the transparent conductive film and the protective film can also prevent the mixing of impurities into the protective film.

Further, although a structure is shown in FIGS. 1A to 1C and 3A to 3C in which light is emitted from the EL layers in a direction toward the sealing substrate, passing through the protective film, the present invention is of course not limited to this structure. For example, light may also be emitted from the EL layers in such a direction as to pass through the interlayer insulating film. In this case color filters are suitably formed on the substrate on which the TFTs are formed.

Embodiment Mode 2

Figure 5A:
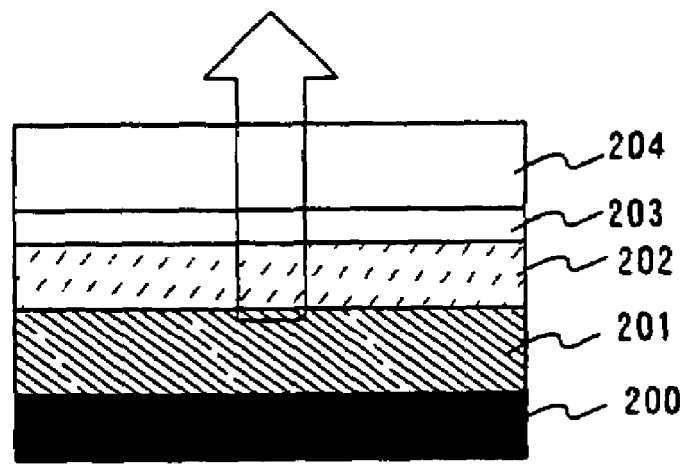
FIGS. 5A and 5B are diagrams showing a laminate structure of the present invention (Embodiment Mode 2)
Figure 5B:
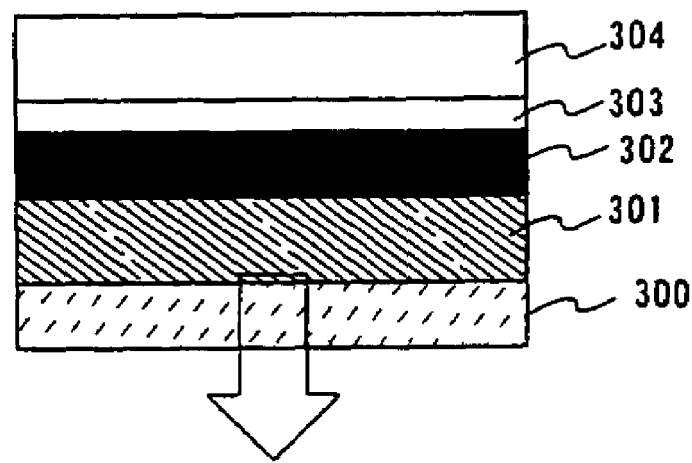

A buffer layer and a protective film are explained here using FIGS. 5A and 5B.

FIG. 5A is a schematic diagram showing an example of a laminate structure for a case in which light is emitted in the direction of an arrow within the figure. In FIG. 5A, reference numeral 200 denotes a cathode (or an anode), reference numeral 201 denotes an EL layer, reference numeral 202 denotes an anode (or a cathode), reference numeral 203 denotes a stress relieving layer (buffer layer), and reference numeral 204 denotes a protective film. A material having light transmitting characteristics, an extremely thin metallic film, or a laminate thereof is used as the electrode 202 when light is emitted in the direction of the arrow in FIG. 5A.

The protective film 204 uses an insulating film obtained by sputtering and having silicon nitride or silicon oxynitride as its main constituent. A silicon nitride film can be obtained provided that the protective film is formed using a silicon target under an atmosphere containing nitrogen and argon. Further, a silicon nitride target may also be used. The buffer layer 203 is formed before forming the protective film in order to relieve internal film stresses in the protective film 204. The buffer layer 203 may be formed by an insulating film having silicon oxide or silicon oxynitride as its main constituent and using a DC sputtering apparatus, an RF sputtering apparatus, or an apparatus using a remote plasma method. When using a sputtering apparatus, the buffer layer may be formed using a silicon target under an atmosphere containing oxygen and argon, or under an atmosphere containing nitrogen, oxygen, and argon. Further, light passes through the protective film, and therefore it is preferable that the film thickness of the protective film be as thin as possible.

Light emitting elements can be protected by using this type of structure, and therefore high reliability can be obtained.

Figure 4:
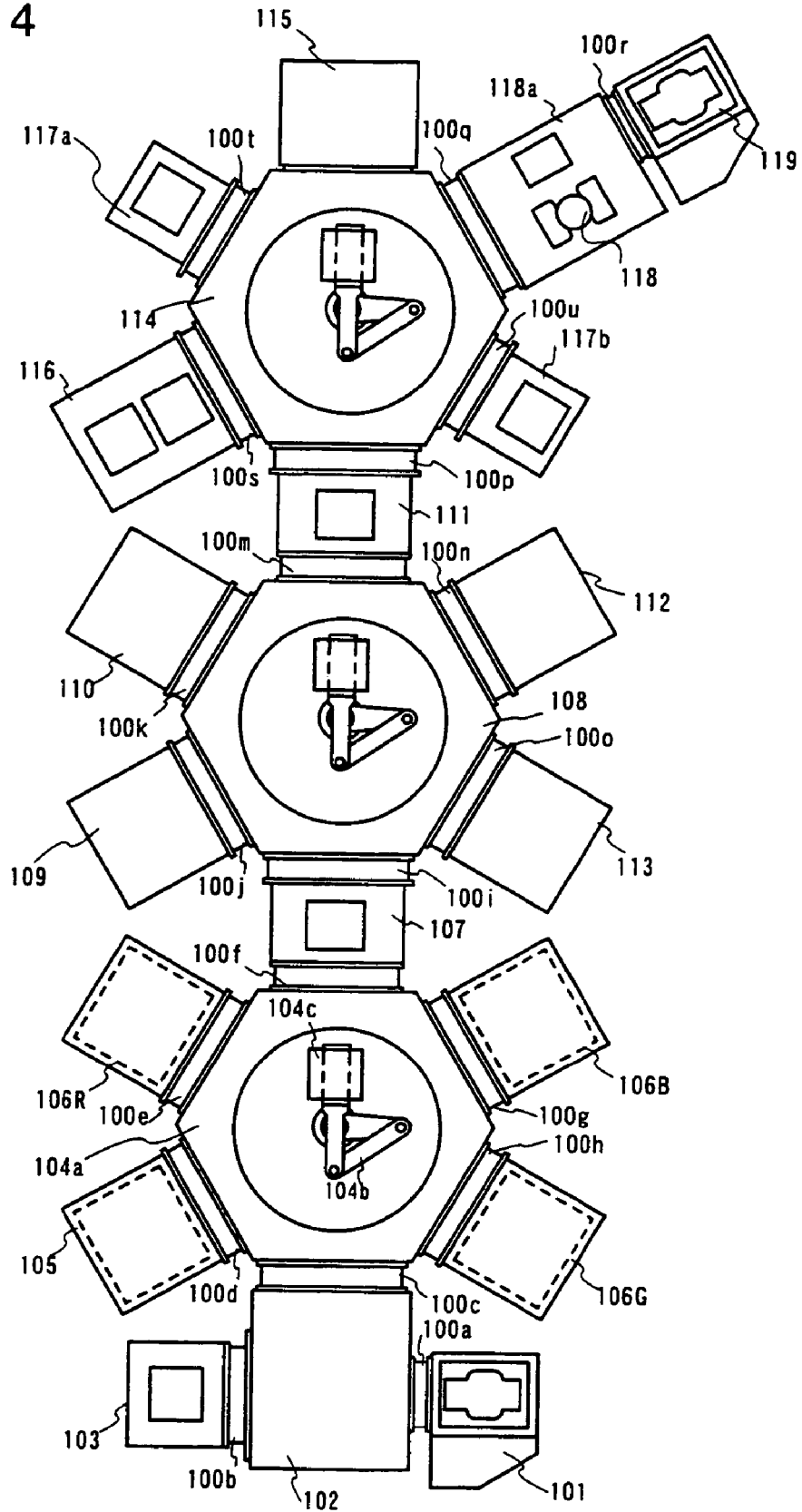
FIG. 4 is a diagram showing a manufacturing apparatus of the present invention (Embodiment Mode 2)

FIG. 5B is a schematic diagram showing an example of a laminate structure for a case in which light is emitted in the direction of an arrow within the figure. In FIG. 4, reference numeral 300 denotes a cathode (or an anode), reference numeral 301 denotes an EL layer, reference numeral 302 denotes an anode (or a cathode), reference numeral 303 denotes a stress relieving layer (buffer layer), and reference numeral 304 denotes a protective film.

Light emitting elements can be protected with this structure, similar to that of FIG. 5A, and therefore high reliability can be obtained.

Further, an example of a manufacturing apparatus (multi-chamber method) capable of separately making the laminate structure of FIG. 5A and the laminate structure of FIG. 5B is shown in FIG. 4.

In FIG. 4, reference numerals 100a to 100k and 100m to 100u denote gates, reference numerals 101 and 119 denote delivery chambers, reference numerals 102, 104a, 107, 108, 111, and 114 denote conveyor chambers, reference numerals 105, 106R, 106B, 106G, 109, 110, 112, and 113 denote film formation chambers, reference numeral 103 denotes a pre-processing chamber, reference numerals 117a and 117b denote sealing substrate loading chambers, reference numeral 115 denotes a dispenser chamber, reference numeral 116 denotes a sealing chamber, and reference numeral 118 denotes an ultraviolet light irradiation chamber.

Procedures for conveying a substrate on which a TFT and a cathode are already formed in advance to the manufacturing apparatus and forming the laminate structure shown in FIG. 5A are shown in FIG. 4.

The substrate on which the TFT and the cathode 200 are formed is first set into the delivery chamber 101. The substrate is then conveyed to the conveyor chamber 102, which is coupled to the delivery chamber 101. It is preferable after vacuum evacuation that an inert gas is introduced into the conveyor chamber to atmospheric pressure so that as little moisture and oxygen as possible exist within the conveyor chamber.

Further, a vacuum evacuation processing chamber for pulling a vacuum within the conveyor chamber is coupled to the conveyor chamber 102. A magnetic levitation turbo molecular pump, a cryo-pump, or a dry pump is provided in the vacuum evacuation processing chamber. It is thus possible to set vacuum level reached in the conveyor chamber from $10^{-5}$ to $10^{-6}$ Pa, and in addition, back diffusion of impurities from the pump side and the exhaust system can be controlled. An inert gas such as nitrogen gas or a noble bas is used as the gas introduced in order to prevent impurities from being introduced inside the apparatus. The gas introduced within the apparatus is purified to a high level by a gas purification apparatus before being introduced within the apparatus. It is therefore necessary to provide a gas purification apparatus whereby gas is introduced into the film formation apparatus after being purified. Oxygen, water, and other impurities contained within the gas can thus be removed in advance, and these impurities can consequently be prevented from being introduced inside the apparatus.

Further, it is preferable to perform annealing for degasification in order to remove moisture and other gasses contained in the substrate. The substrate is conveyed to the preprocessing chamber 103 coupled to the conveyor chamber 102, and annealing may be performed there. In addition, if it is necessary to clean the surface of the cathode, the substrate may be conveyed to the preprocessing chamber 103 coupled to the conveyor chamber 102, and cleaning may be performed there.

A substrate 104c is next conveyed from the conveyor chamber 102 to the conveyor chamber 104 without being exposed to the atmosphere, and then conveyed to the film formation chamber 106R by a conveyor mechanism 104b. A red color light emitting EL layer is then suitably formed on the cathode 200. An example in which the red color light emitting EL layer is formed by evaporation is shown here. The surface of the substrate on which the film is to be formed is set facing downward in the film formation chamber 106R. Note that it is preferable that the film formation chamber be vacuum evacuated before conveying the substrate thereto.

For example, evaporation is performed in the film formation chamber 106R after vacuum evacuation to a vacuum level equal to or less than $5 \times 10^{-3}$ Torr (0.665 Pa), preferably between $10^{-4}$ and $10^{-6}$ Pa. An organic compound is gasified in advance by resistance heating during evaporation, and this scatters toward the substrate during evaporation when a shutter (not shown in the figure) is opened. The gasified organic compound scatters upward, passes through an opening portion (not shown in the figure) formed in a metal mask (not shown in the figure), and is deposited to the substrate. Note that the temperature ($T_1$) of the substrate is set from 50 to 200° C., preferably between 65 and 150° C., by a heating means during evaporation.

For cases in which three types of EL layers are formed in order to provide full color, film formation may sequentially be performed in the film formation chambers 106G and 106B in order after film formation in the film formation chamber 106R is complete.

The substrate is next conveyed from the conveyor chamber 104 to the conveyor chamber 107, without being exposed to the atmosphere, after the predetermined EL layer 201 is formed on the cathode 200. In addition, the substrate is then conveyed form the conveyor chamber 107 to the conveyor chamber 108 without being exposed to the atmosphere.

The substrate is next conveyed to the film formation chamber 109 by a conveyor mechanism placed within the conveyor chamber 108, and the anode 202 made from a transparent conductive film is suitably formed on the EL layer 201. A plurality of targets are set within the film formation chamber 109 here, and a sputtering apparatus is used having at least a target made from a transparent conductive material and a target made from silicon. The anode 202 and the stress relieving layer 203 can therefore be formed in the same chamber. Note that a specialized film formation chamber for forming the stress relieving layer 203 may also be provided separately. In this case a sputtering apparatus (RF sputtering or DC sputtering) or an apparatus using a remote plasma method may be employed.

The substrate is next conveyed from the conveyor chamber 108 to the film formation chamber 113, without being exposed to the atmosphere, and the protective film 204 is formed on the stress relieving layer 203. A sputtering apparatus prepared with a target made form silicon or a target made from silicon nitride is provided within the film formation chamber 113 here. A silicon nitride film can be formed by making the atmosphere within the film formation chamber into a nitrogen atmosphere, or an atmosphere containing nitrogen and argon.

The light emitting element covered with the protective film and the stress relieving layer is thus formed on the substrate by the above processes.

The substrate is next conveyed from the conveyor chamber 108 to the conveyor chamber 111 without being exposed to the atmosphere, and in addition, is conveyed from the conveyor chamber 111 to the conveyor chamber 114.

The substrate on which the light emitting element is formed is next conveyed from the conveyor chamber 114 to the sealing chamber 116. Note that it is preferable to provide a sealing substrate, on which a sealing material is formed, in the sealing chamber 116.

The sealing substrate is set from the outside into the sealing substrate loading chambers 117a and 117b. Note that it is preferable to perform annealing in advance under a vacuum in order to remove impurities such as moisture. For example, annealing may be performed within the sealing substrate loading chambers 117a and 117b. For cases in which a sealing material is formed on the sealing substrate, the sealing substrate is conveyed from the sealing substrate loading chamber to the dispenser chamber 115 after the conveyor chamber 108 is set to atmospheric pressure. A sealing material is then formed for bonding to the substrate on which the light emitting element is formed, and the sealing substrate having the formed sealing material is conveyed to the sealing chamber 116.

The sealing substrate with the formed sealing material and the substrate on which the light emitting element is formed are then bonded to each other under a vacuum or within an inert gas atmosphere. Note that, although an example in which the sealing material is formed on the sealing substrate is shown here, the present invention is not in particular limited to this example, and a sealing material may also be formed on the substrate having the formed light emitting element.

The bonded pair of substrates is next conveyed from the conveyor chamber 114 to the ultraviolet light irradiation chamber 118. UV light is irradiated in the ultraviolet light irradiation chamber 118, thus hardening the sealing material. Note that although an ultraviolet setting resin is used as the sealing material here, there are no particular limitation placed on the sealing material, provided that it is an adhesive material.

The pair of substrates is then conveyed from the conveyor chamber 114 to the delivery chamber 119, and taken out.

Processing up through completely sealing the light emitting element into a hermetic space is thus completed by using the manufacturing apparatus shown in FIG. 4, without being exposed to the atmosphere, and therefore it becomes possible to manufacture a light emitting device having high reliability.

Note that it is also possible to use an inline film formation apparatus.

Procedures for forming the laminate structure shown in FIG. 5B are shown below. A substrate on which a TFT and an anode are formed in advance is conveyed to the manufacturing apparatus shown in FIG. 4.

First, a substrate on which a TFT and the anode 300 are formed is set in the delivery chamber 101. The substrate is then conveyed to the conveyor chamber 102 coupled to the delivery chamber 101. It is preferable to introduce an inert gas at atmospheric pressure within the conveyor chamber after performing vacuum evaporation so that as little moisture and oxygen as possible exist within the conveyor chamber. A transparent conductive material is used as a material for forming the anode 300, and an indium tin compound, zinc oxide, and the like can be used. The substrate is next conveyed to the preprocessing chamber 103, which is coupled to the conveyor chamber 102. Cleaning, oxidation processing, heat treatment processing, and the like may be performed on the surface of the anode in the preprocessing chamber. The irradiation of ultraviolet light within a vacuum, or oxygen plasma processing is performed as a method of cleaning the anode surface. Further, the irradiation of ultraviolet light within an atmosphere containing oxygen may be performed while heating to a temperature of 100 to 120° C. as an oxidation process, and this is effective for cases in which the anode is an oxide such as ITO. Further, heat treatment may be performed under a vacuum at a heat treatment temperature, which the substrate is capable of withstanding, greater than or equal to 50° C., preferably between 65 and 150° C., as the heat treatment process. Impurities such as oxygen and moisture adsorbed on the substrate, and impurities such as oxygen and moisture within films formed on the substrate can thus be removed. In particular, EL materials are easily degraded by impurities such as oxygen and water, and therefore it is effective to perform heat treatment within a vacuum before evaporation.

The substrate 104c is next conveyed from the conveyor chamber 102 to the conveyor chamber 104 without being exposed to the atmosphere, and then conveyed to the film formation chamber 105 by the conveyor mechanism 104b. One layer of an EL layer, such as a hole injecting layer or a hole transporting layer, is then suitably formed on the anode 300. An example of forming the EL layer by evaporation is shown here. The surface of the substrate on which the film is to be formed is set facing downward in the film formation chamber 105. Note that it is preferable to perform vacuum evacuation within the film formation chamber before conveying the substrate inside.

The substrate is next conveyed to the film formation chamber 106R, without being exposed to the atmosphere, by the conveyor mechanism 104b, and a red color light emitting EL layer is suitably formed on the hole injecting layer or the hole transporting layer.

For cases in which three types of EL layers are formed in order to provide full color, film formation may be performed in the film formation chambers 106G and 106B in order after film formation in the film formation chamber 106R is complete.

The substrate is next conveyed from the conveyor chamber 104 to the conveyor chamber 107, without being exposed to the atmosphere, after the predetermined EL layer 301 is formed on the anode 300. In addition, the substrate is then conveyed form the conveyor chamber 107 to the conveyor chamber 108 without being exposed to the atmosphere.

The substrate is next conveyed to the film formation chamber 110 or 112 by a conveyor mechanism provided within the conveyor chamber 108, and the cathode 302 made from a metallic material is suitably formed on the EL layer 301. The film formation chamber 111 is an evaporation apparatus or a sputtering apparatus here.

The substrate is next conveyed from the conveyor chamber 108 to the film formation apparatus 113 without being exposed to the atmosphere, and the stress relieving layer 303 and the protective film 304 are formed. A sputtering apparatus prepared with a target made form silicon, a target made from silicon nitride, or a target made form silicon oxide is provided within the film formation chamber 113 here. A silicon oxide film, a silicon oxynitride film, or a silicon nitride film can be formed by making the film formation chamber atmosphere into a nitrogen atmosphere, an atmosphere containing nitrogen and argon, or an atmosphere containing oxygen, nitrogen, and argon.

The light emitting layer covered with the protective film and the stress relieving layer can thus be formed on the substrate by the above processes.

Subsequent process steps are identical to the procedures for forming the laminate structure shown in FIG. 5A, and therefore an explanation thereof is omitted here.

The laminate structure shown in FIG. 5A and the laminate structure shown in FIG. 5B can thus both be formed by using the manufacturing apparatus shown in FIG. 4.

Further, Embodiment Mode 2 can be freely combined with Embodiment Mode 1.

The present invention having the above structure is explained in greater detail by the embodiments shown below.

Embodiment 1

Figure 6:
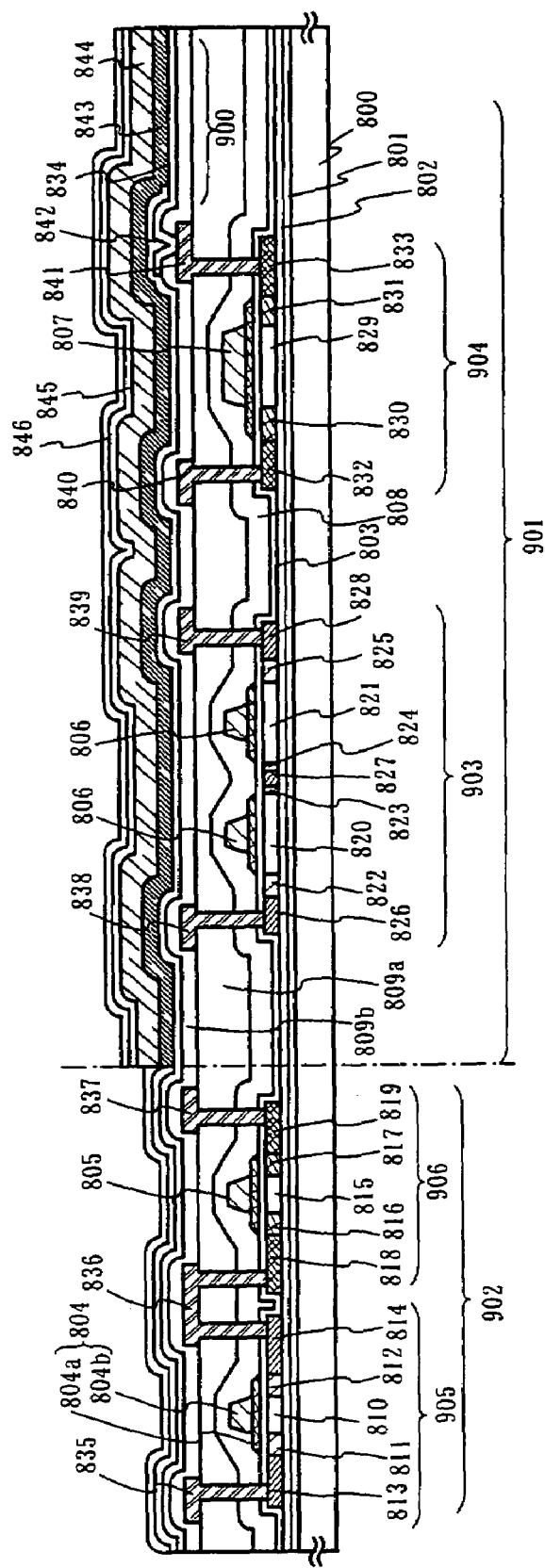
FIG. 6 is a diagram showing the structure of an active matrix EL display device.

In this embodiment, an active matrix type light emitting device manufactured on an insulating film will be described. FIG. 6 is a cross sectional view of the active matrix type light emitting device. As an active element, a thin film transistor (hereafter referred to as TFT) is used here, a MOS transistor may also be used.

A top gate TFT (specifically a planar TFT) is shown as an example, a bottom gate TFT (typically inversely staggered TFT) may also be used.

In this embodiment, a substrate 800 is used, which is made of barium borosilicate glass or alumino borosilicate glass, a quartz substrate, a silicon substrate, a metal substrate, or stainless substrate forming an insulating film on the surface may be used. A plastic substrate having heat resistance enduring a treatment temperature of this embodiment also may be used, and further a flexible substrate may be used.

Next, a silicon oxynitride film is formed as a lower layer 801 of a base insulating film on a heat-resistant glass substrate (the substrate 800) with a thickness of 0.7 mm by plasma CVD at a temperature of 400° C. using $SiH_4$, $NH_3$, and $N_2O$ as material gas (the composition ratio of the silicon oxynitride film: Si=32%, O=27%, N=24%, H=17%). The silicon oxynitride film has a thickness of 50 nm (preferably 10 to 200 nm). The surface of the film is washed with ozone water and then an oxide film on the surface is removed by diluted fluoric acid (diluted down to 1/100). Next, a silicon oxynitride film is formed as an upper layer 802 of the base insulating film by plasma CVD at a temperature of 400° C. using $SiH_4$ and $N_2O$ as material gas (the composition ratio of the silicon oxynitride film: Si=32%, O=59%, N=7%, H=2%). The silicon oxynitride film has a thickness of 100 nm (preferably 50 to 200 nm) and is laid on the lower layer to form a laminate. Without exposing the laminate to the air, a semiconductor film having an amorphous structure (here, an amorphous silicon film) is formed on the laminate by plasma CVD at a temperature of 300° C. using $SiH_4$ as material gas. The semiconductor film (an amorphous silicon film is used here) is 54 nm (preferably 25 to 200 nm) in thickness.

A base insulating film in this embodiment has a two-layer structure. However, the base insulating film may be a single layer or more than two layers of insulating films mainly containing silicon. The material of the semiconductor film is not limited but it is preferable to form the semiconductor film from silicon or a silicon germanium alloy ($Si_xGe_{1-x}$ (X=0.0001 to 0.02)) by a known method (sputtering, LPCVD, plasma CVD, or the like). Plasma CVD apparatus used may be one that processes wafer by wafer or one that processes in batch. The base insulating film and the semiconductor film may be formed in succession in the same chamber to avoid contact with the air.

The surface of the semiconductor film having an amorphous structure is washed and then a very thin oxide film, about 2 nm in thickness, is formed on the surface using ozone water. Next, the semiconductor film is doped with a minute amount of impurity element (boron or phosphorus) in order to control the threshold of the TFTs. Here, the amorphous silicon film is doped with boron by ion doping in which diborane ($B_2H_6$) is excited by plasma without mass separation. The doping conditions include setting the acceleration voltage to 15 kV, the flow rate of gas obtained by diluting diborane to 1% with hydrogen to 30 sccm, and the dosage to $2\times10^{12}$ atoms/$cm^2$.

Next, a nickel acetate solution containing 10 ppm of nickel by weight is applied by a spinner. Instead of application, nickel element may be sprayed onto the entire surface by sputtering.

The semiconductor film is subjected to heat treatment to crystallize it and obtain a semiconductor film having a crystal structure. The heat treatment is achieved in an electric furnace or by irradiation of intense light. When heat treatment in an electric furnace is employed, the temperature is set to 500 to 650° C. and the treatment lasts for 4 to 24 hours. Here, a silicon film having a crystal structure is obtained by heat treatment for crystallization (at 550° C. for 4 hours) after heat treatment for dehydrogenation (at 500° C. for an hour). Although the semiconductor film is crystallized here by heat treatment using an electric furnace, it may be crystallized by a lamp annealing apparatus capable of achieving crystallization in a short time.

After an oxide film on the surface of the silicon film having a crystal structure is removed by diluted fluoric acid or the like, a continuous oscillating solid-state laser and the second to fourth harmonic of the fundamental wave are employed in order to obtain crystals of large grain size when crystallizing an amorphous semiconductor film. Since the laser light irradiation is conducted in the air or in an oxygen atmosphere, an oxide film is formed on the surface as a result. Typically, the second harmonic (532 nm) or third harmonic (355 nm) of a Nd:$YVO_4$ laser (fundamental wave: 1064 nm) is employed. When using a continuous wave laser, laser light emitted from a 10 W power continuous wave $YVO_4$ laser is converted into harmonic by a non-linear optical element. Alternatively, the harmonic is obtained by putting a $YVO_4$ crystal and a non-linear optical element in a resonator. The harmonic is preferably shaped into oblong or elliptical laser light on an irradiation surface by an optical system and then irradiates an irradiation object. The energy density required at this point is about 0.01 to 100 MW/$cm^2$ (preferably 0.1 to 10 MW/$cm^2$). During the irradiation, the semiconductor film is moved relative to the laser light at a rate of 10 to 2000 cm/s.

Of course, although a TFT can be formed by using the silicon film having a crystalline structure before the second harmonics of the continuous oscillating $YVO_4$ laser is irradiated thereon, it is preferable that the silicon film having a crystalline structure after the laser light is irradiated thereon is used to form the TFT since the silicon film irradiated the laser light thereon has an improved crystallinity and electric characteristics of TFT are improved. For instance, although, when TFT is formed by using the silicon film having a crystalline structure before the laser light is irradiated thereon, a mobility is almost 300 $cm^2$/Vs, when TFT is formed by using the silicon film having a crystalline structure after the laser light is irradiated thereon, the mobility is extremely improved with about 500 to 600 $cm^2$/Vs.

After the crystallization is conducted using nickel as a metal element that promotes crystallization of silicon, the continuous oscillating $YVO_4$ laser is irradiated thereon though, not limited thereof, after the silicon film is formed having an amorphous structure and the heat treatment is performed for dehydrogenation, and the silicon film having a crystalline structure may be obtained by the second harmonics of the continuous oscillating $YVO_4$ laser is irradiated.

The pulse oscillation laser may be used for as a substitute for the continuous oscillating laser. In the case that the excimer laser of the pulse oscillation is used, it is preferable that the frequency is set to 300 Hz, and the laser energy density is set from 100 to 1000 mJ/$cm^2$ (typically 200 to 800 mJ/$cm^2$). Here, the laser light may be overlapped 50 to 98%.

The oxide film formed by laser light irradiation is removed by diluted fluoric acid and then the surface is treated with ozone water for 120 seconds to form as a barrier layer composed of an oxide film having a thickness of 1 to 5 nm in total. The barrier layer here is formed using ozone water but it may be formed by oxidizing the surface of the semiconductor film having a crystal structure through ultra-violet irradiation in an oxygen atmosphere, or formed by oxidizing the surface of the semiconductor film having a crystal structure through oxygen plasma treatment, or by using plasma CVD, sputtering or evaporation to form an about 1 to 10 nm thick oxide film. The oxide film formed by the laser light irradiation may be removed before the barrier layer is formed.

Next, an amorphous silicon film containing argon is formed on the barrier layer by plasma CVD or sputtering to serve as a gettering site. The thickness of the amorphous silicon film is 50 to 400 nm, here 150 nm. The amorphous silicon film is formed in an argon atmosphere with the film formation pressure to 0.3 Pa by sputtering using the silicon target.

Thereafter, heat treatment is conducted in an electric furnace at 650° C. for 3 minutes for gettering to reduce the nickel concentration in the semiconductor film having a crystal structure. Lamp annealing apparatus may be used instead of an electric furnace.

Using the barrier layer as an etching stopper, the gettering site, namely, the amorphous silicon film containing argon, is selectively removed. Then, the barrier layer is selectively removed by diluted fluoric acid. Nickel tends to move toward a region having high oxygen concentration during gettering, and therefore it is desirable to remove the barrier layer that is an oxide film after gettering.

Next, a thin oxide film is formed on the surface of the obtained silicon film containing a crystal structure (also referred to as a polysilicon film) using ozone water. A resist mask is then formed and the silicon film is etched to form island-like semiconductor layers separated from one another and having desired shapes. After the semiconductor layers are formed, the resist mask is removed.

The oxide film is removed by an etchant containing fluoric acid, and at the same time, the surface of the silicon film is washed. Then, an insulating film mainly containing silicon is formed to serve as a gate insulating film 803. The gate insulating film here is a silicon oxynitride film (composition ratio: Si=32%, O=59%, N=7%, H=2%) formed by plasma CVD to have a thickness of 115 nm.

Next, a laminate of a first conductive film with a thickness of 20 to 100 nm and a second conductive film with a thickness of 100 to 400 nm is formed on the gate insulating film. In this embodiment, a tantalum nitride film with a thickness of 50 nm is formed on the gate insulating film 803 and then a tungsten film with a thickness of 370 nm is laid thereon. The conductive films are patterned by the procedure shown below to form gate electrodes and wirings.

The conductive materials of the first conductive film and second conductive film are elements selected from the group consisting of Ta, W, Ti, Mo, Al, and Cu, or alloys or compounds mainly containing the above elements. The first conductive film and the second conductive film may be semiconductor films, typically polycrystalline silicon films, doped with phosphorus or other impurity elements or may be Ag—Pd—Cu alloy films. The present invention is not limited to a two-layer structure conductive film. For example, a three-layer structure consisting of a 50 nm thick tungsten film, 500 nm thick aluminum-silicon alloy (Al—Si) film, and 30 nm thick titanium nitride film layered in this order may be employed. When the three-layer structure is employed, tungsten of the first conductive film may be replaced by tungsten nitride, the aluminum-silicon alloy (Al—Si) film of the second conductive film may be replaced by an aluminum-titanium alloy (Al—Ti) film, and the titanium nitride film of the third conductive film may be replaced by a titanium film. Alternatively, a single-layer conductive film may be used.

ICP (inductively coupled plasma) etching is preferred for etching of the first conductive film and second conductive film (first etching treatment and second etching treatment). By using ICP etching and adjusting etching conditions (the amount of electric power applied to a coiled electrode, the amount of electric power applied to a substrate side electrode, the temperature of the substrate side electrode, and the like), the films can be etched and tapered as desired. The first etching treatment is conducted after a mask made of resist is formed. The first etching conditions include applying an RF (13.56 MHz) power of 700 W to a coiled electrode at a pressure of 1 Pa, employing $CF_4$, $Cl_2$, and $O_2$ as etching gas, and setting the gas flow rate ratio thereof to 25:25:10 (sccm). The substrate side (sample stage) also receives an RF (13.56 MHz) power of 150 W to apply a substantially negative self-bias voltage. The area (size) of the substrate side electrode is 12.5 cm×12.5 cm and the coiled electrode is a disc 25 cm in diameter (here, a quartz disc on which the coil is provided). The W film is etched under these first etching conditions to taper it around the edges. Thereafter, the first etching conditions are switched to the second etching conditions without removing the mask made of resist. The second etching conditions include using $CF_4$ and $Cl_2$ as etching gas, setting the gas flow rate ratio thereof to 30:30 (sccm), and giving an RF (13.56 MHz) power of 500 W to a coiled electrode at a pressure of 1 Pa to generate plasma for etching for about 30 seconds. The substrate side (sample stage) also receives an RF power of 20 W (13.56 MHz) to apply a substantially negative self-bias voltage. Under the second etching conditions where a mixture of $CF_4$ and $Cl_2$ is used, the W film and the TaN film are etched to almost the same degree. The first etching conditions and the second etching conditions constitute the first etching treatment.

Next follows the second etching treatment with the resist mask kept in place. The third etching conditions include using $CF_4$ and $Cl_2$ as etching gas, setting the gas flow rate ratio thereof to 30:30 (sccm), and giving an RF (13.56 MHz) power of 500 W to a coiled electrode at a pressure of 1 Pa to generate plasma for etching for 60 seconds. The substrate side (sample stage) also receives an RF power of 20 W (13.56 MHz) to apply a substantially negative self-bias voltage. Then, the third etching conditions are switched to the fourth etching conditions without removing the resist mask. The fourth etching conditions include using $CF_4$, $Cl_2$, and $O_2$ as etching gas, setting the gas flow rate ratio thereof to 20:20:20 (sccm), and giving an RF (13.56 MHz) power of 500 W to a coiled electrode at a pressure of 1 Pa to generate plasma for etching for about 20 seconds. The substrate side (sample stage) also receives an RF power of 20 W (13.56 MHz) to apply a substantially negative self-bias voltage. The third etching conditions and the fourth etching conditions constitute the second etching treatment. At this stage, gate electrode 804 and wirings 805 to 807 having the first conductive layer 804*a* as the lower layer and the second conductive layer 804*b* as the upper layer are formed.

Next, the mask made of resist is removed for the first doping treatment to dope with the entire surface using the gate electrodes 804 to 807 as masks. The first doping treatment employs ion doping or ion implantation. Here, ion doping conditions are that the dosage is set to $1.5 \times 10^{14}$ atoms/cm$^2$, and the acceleration voltage is set from 60 to 100 keV. As an impurity elements that imparts the n-type conductivity, phosphorus (P) or arsenic (As) is typically used. The first impurity region (n$^-$ region) 822 to 825 are formed in a self-aligning manner.

Masks made of resist are newly formed. At this moment, since the off current value of the switching TFT 903 is lowered, the masks are formed to overlap the channel formation region of a semiconductor layer forming the switching TFT 903 of the pixel portion 901, and a portion thereof. The masks are formed to protect the channel formation region of the semiconductor layer forming the p-channel TFT 906 of the driver circuit and the periphery thereof. In addition, the masks are formed to overlap the channel formation region of the semiconductor layer forming the current control TFT 904 of the pixel portion 901 and the periphery thereof.

An impurity region (n$^-$ region) that overlaps with a portion of the gate electrode is formed by conducting selectively the second doping treatment using the masks made of resist. The second doping treatment is employs ion doping or ion implantation. Here, ion doping is used, the flow rate of gas obtained by diluting phosphine ($PH_3$) with hydrogen to 5% is set to 30 sccm, the dose is set to $1.5 \times 10^{14}$ atoms/cm$^2$, and the acceleration voltage is set to 90 keV. In this case the masks made from resist and the second conductive layer serve as masks against the impurity element that imparts the n-type conductivity and second impurity regions 311 and 312 are formed. The second impurity regions are doped with the impurity element that imparts the n-type conductivity in a concentration range of $1\times10^{16}$ to $1\times10^{17}$ atoms/cm$^3$. Here, the same concentration range as the second impurity region is referred to as a n$^+$ region.

Third doping treatment is conducted without removing the masks made of resist. The third doping treatment is employs ion doping or ion implantation. As impurity elements imparts n-type conductivity, phosphorus (P) or arsenic (As) are used typically. Here, ion doping is used, the flow rate of gas obtained by diluting phosphine (PH$_3$) with hydrogen to 5% is set to 40 sccm, the dosage is set to $2\times10^{15}$ atoms/cm$^2$, and the acceleration voltage is set to 80 keV. In this case the masks made of resist, the first conductive layer and the second conductive layer serve as masks against the impurity element that imparts the n-type conductivity and third impurity regions 813, 814, 826 to 828 are formed. The third impurity regions are doped with the impurity element that imparts the n-type conductivity in a concentration range of $1\times10^{20}$ to $1\times10^{21}$ atoms/cm$^3$. Here, the same concentration range as the third impurity region is referred to as a n$^+$ region.

After removing the resist mask and the new resist mask is formed, the fourth doping treatment is conducted. The fourth impurity regions 818, 819, 832, 833 and the fifth impurity regions 816, 817, 830, 831 are formed in which impurity elements imparts p-type conductivity are added to the semiconductor layer forming the p-channel TFT by the fourth doping treatment.

The concentration of the impurity element that imparts the p-type conductivity is set from $1\times10^{20}$ to $1\times10^{21}$ atoms/cm$^3$ to add to the fourth impurity regions 818, 819, 832, and 833. The fourth impurity regions 818, 819, 832, and 833 being region (n$^-$ region) are already doped with phosphorus (P) in the previous step but are doped with the impurity element that imparts the p-type conductivity in a concentration 1.5 to 3 times the phosphorus concentration to obtain the p-type conductivity. Here, a region having the same concentration range as the fourth impurity regions is also called a p$^+$ region.

The fifth impurity regions 816, 817, 830, and 831 are formed in the region overlaps with the taper portion of the second conductive layer. The impurity elements imparts p-type conductivity is added thereto at the concentration range from $1\times10^{18}$ to $1\times10^{20}$ atoms/cm$^3$. Here, the region having the same concentration range as the fifth impurity regions is referred to as p$^-$ region.

Through the above steps, an impurity region having the n-type or p-type conductivity is formed in each semiconductor layer. The conductive layers 804 to 807 become the gate electrode of TFT.

An insulating is formed to cover almost the entire surface (not shown). In this embodiment, the silicon oxide film having 50 nm in thickness is formed by plasma CVD method. Of course, the insulating film is not limited to a silicon oxide film and a single layer or laminate of other insulating films containing silicon may be used.

The next step is activation treatment of the impurity elements used to dope the respective semiconductor layers. The activation step employs rapid thermal annealing (RTA) using a lamp light source, irradiation of a laser, heat treatment using a furnace, or a combination of these methods.

This embodiment shows as an example that the insulating film is formed before the above-described activation. However, the insulating film may be formed before the activation.

The first interlayer insulating film 808 made from a silicon nitride film is formed. Then, the semiconductor layers are subjected to heat treatment (at 300 to 550° C. for 1 to 12 hours) to hydrogenate the semiconductor layers. This step is for terminating dangling bonds in the semiconductor layers using hydrogen contained in the first interlayer insulating film 808. The semiconductor layers are hydrogenated irrespective of the presence of the insulating film made from a silicon oxide film. Other hydrogenation methods employable include plasma hydrogenation (using hydrogen excited by plasma).

Next, a second interlayer insulating film 809a is formed on the first interlayer insulating film 808 from an organic insulating material. In this embodiment, an acrylic resin film 809a is formed to have a thickness of 1.6 μm.

Formed next are contact holes reaching the conductive layers that serve as the gate electrodes or gate wires and contact holes reaching the respective impurity regions. In this embodiment, etching treatment is conducted several times in succession. Also, in this embodiment, the first interlayer insulating film is used as an etching stopper to etch the second interlayer insulating film, and then the first interlayer insulating film is etched.

Thereafter, electrodes 835 to 841, specifically, a source wiring, a power supply line, a lead-out electrode, a connection electrode, etc. are formed from Al, Ti, Mo, W, etc. Here, the electrodes and wirings are obtained by patterning a laminate of a Ti film (100 nm in thickness), an Al film containing silicon (350 nm in thickness), and another Ti film (50 nm in thickness). The source electrode, source wiring, connection electrode, lead-out electrode, power supply line, and the like are thus formed as needed. A lead-out electrode for the contact with a gate wiring covered with an interlayer insulating film is provided at an end of the gate wiring, and other wirings also have at their ends input/output terminal portions having a plurality of electrodes for connecting to external circuits and external power supplies.

A driver circuit 902 having a CMOS circuit in which an n-channel TFT 905 and a p-channel TFT 906 are combined complementarily and a pixel portion 901 with a plurality of pixels each having an n-channel TFT 903 or a p-channel TFT 904 are formed in the manner described above.

Next, a third interlayer insulating film 809b made from an inorganic insulating material is formed on the second interlayer insulating film 809a. The silicon nitride film 809b with a thickness of 200 nm is formed by sputtering here.

Next, a contact hole is formed so as to reach the connection electrode 841 formed in contact with the drain region of the current control TFT 904 made from a p-channel TFT. A pixel electrode 834 is formed so as to contact and overlap with the connection electrode 841. In this embodiment, the pixel electrode 834 functions as an anode of an organic light emitting element, and the pixel electrode 834 serves a transparent conductive film in order to transmit the light emission emitted from the organic light emitting element to the pixel electrode and the substrate.

An inorganic insulator 842 is formed on each end of the pixel electrode 834 so as to cover the each end of the pixel electrode 834. It is preferable that the inorganic insulator 842 is formed from an insulating film containing silicon by sputtering and then patterned. Further, a bank formed from an organic insulator may be formed for as a substitute for the inorganic insulator 842.

Next, an EL layer 843 and the cathode 844 of the organic light emitting element are formed on the pixel electrode 834 whose ends are covered by the inorganic insulator 842. In this embodiment, the EL layer 843 may be formed by ink jet method, evaporation, spin coating method and the like.

An EL layer 843 (a layer for light emission and for moving of carriers to cause light emission) may be formed by freely combining a light emitting layer, an electric charge transporting layer and an electric charge injection layer. For example, a low molecular weight organic EL material or a high molecular weight organic EL material is used to form an EL layer. An EL layer may be a thin film formed of a light emitting material that emits light by singlet excitation (fluorescence) (a singlet compound) or a thin film formed of a light emitting material that emits light by triplet excitation (phosphorescence) (a triplet compound). Inorganic materials such as silicon carbide may be used for the electric charge transporting layers and electric charge injection layers. Known organic EL materials and inorganic materials can be employed.

It is said that the preferred material of a cathode 844 is a metal having a small work function (typically, a metal element belonging to Group 1 or 2 in the periodic table) or an alloy of such metal. The light emission efficiency is improved as the work function becomes smaller. Therefore, an alloy material containing Li (lithium) that is one of alkali metals is particularly desirable as the cathode material.

Next, a protective film 846 covering the cathode 844 is formed. As the protective film 846, an insulating film having silicon nitride or silicon oxynitride as its main constituent may be formed. It is preferable that a buffer layer 845 is formed in order to relieve a film pressure of the protective film 846. The protective film 846 prevents the intrusion of substances such as moisture and oxygen, which accelerate deterioration due to oxidization of the EL layer from outside. As the buffer layer 845, an insulating film having silicon oxide or silicon oxynitride as its main constituent may be formed. The buffer layer 845 can prevent intrusion of impurity elements from the cathode 844 during the film deposition. However, it is not necessary to provide the protective film or the like in the input/output terminal portions to which an FPC needs to be connected later.

The stage completed so far steps is shown in FIG. 6. Though the switching TFT 903 and the current supply TFT for an organic light emitting element (the current control TFT 904) are shown in FIG. 6, it goes without saying that it is not limited thereof, various circuits formed from plural TFTs may be provided at the end of the gate electrode of the TFT.

Next, the organic light emitting element having at least a cathode, an organic compound layer, and an anode is preferably sealed by a sealing substrate or a sealing can to cut the organic light emitting element completely off from the outside and prevent permeation of external substances, such as moisture and oxygen, that accelerate degradation due to oxidization of the EL layer.

The FPC (flexible printed circuit) is attached to the electrodes of the input/output terminal portions using an anisotropic conductive material. The anisotropic conductive material is composed of a resin and conductive particles several tens to several hundreds μm in diameter whose surfaces are plated by Au or the like. The conductive particles electrically connect the respective electrodes of the input/output terminal portions with wirings formed in the FPC.

Further, color filters corresponding to the respective pixels are formed on the substrate. By forming the color filters, it is not necessary to form a circular polarizing plate. If necessary, other optical film may be provided and an IC chip etc. may be mounted.

Through the above steps, a module type light emitting device to which an FPC is connected is completed.

This embodiment may be freely combined with Embodiment Modes 1 or 2.

Embodiment 2

The top surface view and the cross-sectional view of the module type light emitting device (also referred to as EL module) obtained by Embodiment 1 are shown.

Figure 7A:
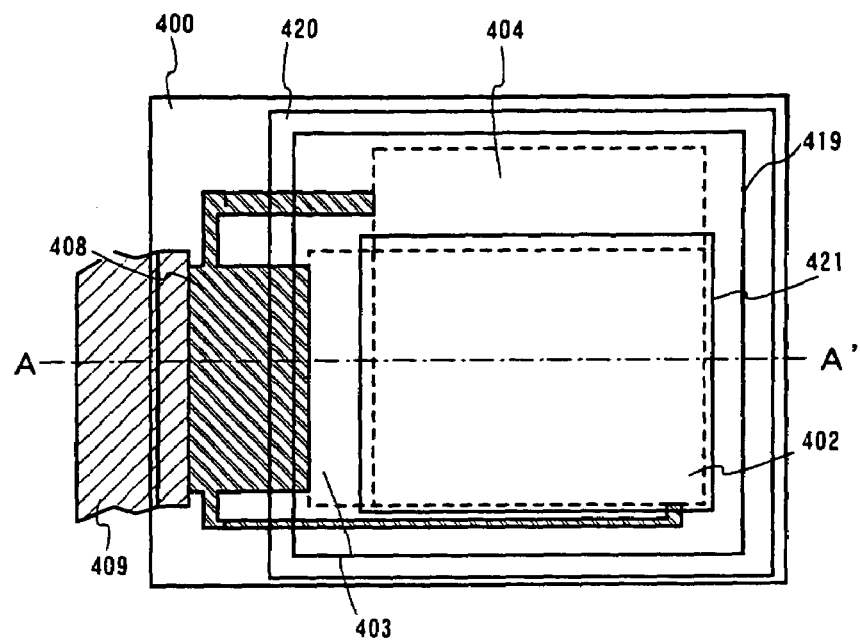
FIGS. 7A and 7B are diagrams showing the structure of an active matrix EL display device.
Figure 7B:
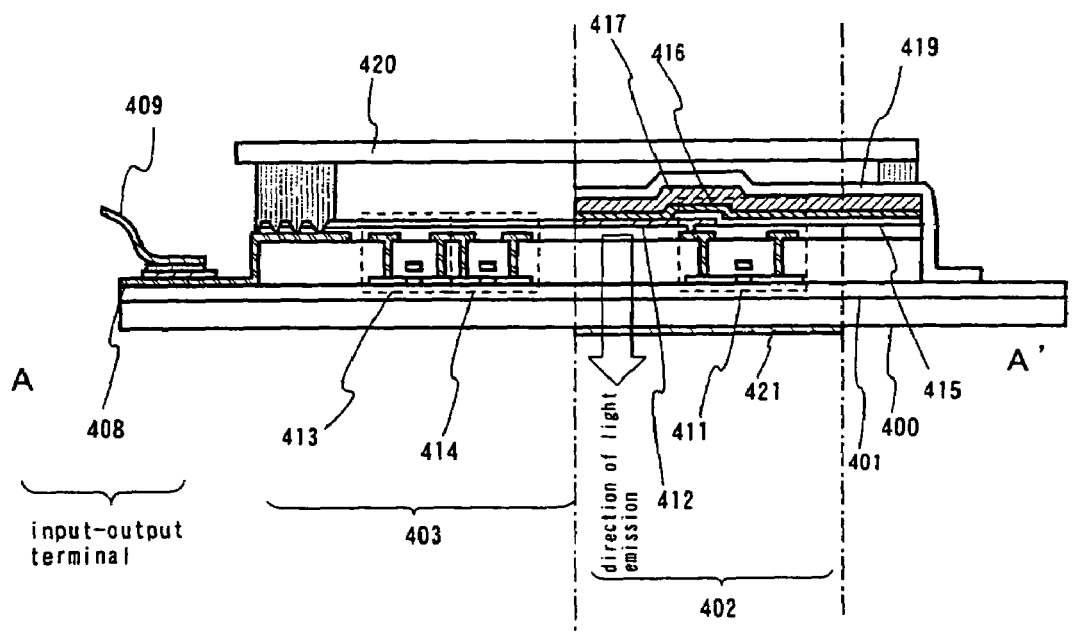

FIG. 7A is a view of a top surface view of EL module and FIG. 7B is a cross-sectional view taken along the line of A–A' of FIG. 7A. FIG. 7A shows that the base insulating film 401 is formed on the substrate 400 (such as a heat resistant glass, for example), and the pixel portion 402, the source side driver circuit 404, and the gate side driver circuit 403 are formed thereon. These pixel portion and driver circuit may be obtained according to above-mentioned Embodiment 1.

The reference numeral 419 is a protective film. The pixel portion and the driver circuit portion are covered by the protective film 419. In addition, the protective film may be sealed by the cover material 420 using the bonding member. A sealing substrate (such as a glass substrate and a plastic substrate) may be used as the cover material 420, and a space between the EL layer and the cover material 420 may be filled with inert gas. Furthermore, a desiccant agent may be provided in the cover material 420 by a double-stick tape.

In addition, reference numeral 408 represents a wiring for transmitting signals to be inputted into the source side driver circuit 404 and the gate side driver circuit 403, and it receives a video signal and a clock signal from the FPC (flexible printed circuit) 409 which becomes an external input terminal. In addition, here, only FPC is shown in the figure, but a printed wiring board (PWB) may be attached to this FPC. A light emitting device in the present specification is assumed to contain not only a light emitting device itself but also a state in which FPC or PWB is attached thereto.

The cross-sectional structure shown in FIG. 7B is described. A base insulating film 401 is formed on the substrate 400. The pixel portion 402 and the gate side driver circuit 403 are formed over the insulating film 401. The pixel portion 402 is composed of the current control TFT 411 and plural pixels including the pixel electrode 412 that is connected electrically to the drain of the current control TFT 411. In addition, the gate side driver circuit 403 is formed by using a CMOS circuit that is combined with the n-channel TFT 413 and the p-channel TFT 414.

The TFTs (including 411, 413, and 414) may be manufactured according to n-channel TFT of Embodiment 1 and p-channel TFT of Embodiment 1. Though only the current supply TFT for the organic light emitting element (the current control TFT 411) is shown in FIG. 7, it goes without saying that it is not limited thereof, various circuits formed from plural TFTs may be provided at the end of the gate electrode of TFT.

The pixel portion 402, the source side driver circuit 404, and the gate side driver circuit 403 are formed on the same substrate according to Embodiment 1.

The pixel electrode 412 functions as a cathode of the light emitting element (OLED). The inorganic insulator 415 is formed at the both ends portion of the pixel electrode 412. The organic compound layer 416 and the anode 417 of the light emitting element are formed on the pixel electrode 412.

As the organic compound layer 416, it should be appreciated that the organic compound layer (a layer for carrying out light emission and movement of carriers therefore) may be formed by freely combining a light emitting layer, an electric charge transport layer or an electric charge injection layer.

The anode 417 functions as a common wiring to all pixels, and is electrically connected to an FPC 409 through a connection wiring 408. Further, elements which are contained in the pixel portion 402 and the gate side driver circuit 403 are all covered by a protective film 419.

The protective film may be formed on the entire surface including the back surface of the substrate 400. In such a case, it is necessary to carefully form the protective film so that no protective film is formed at a portion where the external input terminal (FPC) is provided. A mask may be used to prevent film forming of the protective film at this position. The external input terminal portion may be covered with a tape such as a tape made of Teflon (registered trademark) used as a masking tape in a CVD apparatus to prevent film forming of the protective film. The silicon nitride film, the DLC film, or AlNxOy film may be used as the protective film 419.

The light emitting element constructed as described above is enclosed with the protective film 419 to completely isolate the light emitting element from the outside, thus preventing materials such as moisture and oxygen which accelerate degradation of the organic compound layer by oxidation from entering from the outside. Thus, the light emitting device having improved reliability is obtained. The steps from the deposition to the sealing of EL layer may be conducted by using the apparatus shown in FIG. 4.

Figure 8:
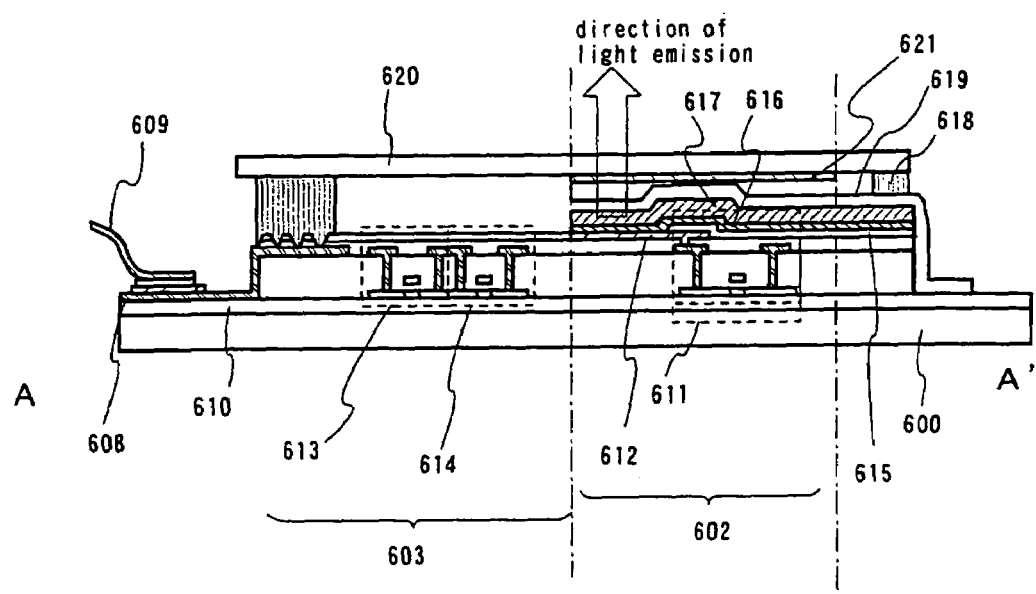
FIG. 8 is a diagram showing the structure of an active matrix EL display device.

Another arrangement is conceivable in which a pixel electrode is used as an anode and an organic compound layer and a cathode are made in lamination to emit light in a direction opposite to the direction indicated in FIG. 7. FIG. 8 shows an example of such an arrangement. The top view thereof is the same as the top view shown in FIG. 7 and will therefore be omitted.

The structure shown in the cross-sectional view of FIG. 8 will be described. An insulating film 610 is formed on a substrate 600, and a pixel portion 602 and a gate-side drive circuit 603 are formed above the insulating film 610. The pixel portion 602 is formed by a plurality of pixels including a current control TFT 611 and a pixel electrode 612 electrically connected to the drain of the current control TFT 611. A gate side driver circuit 603 is formed by using a CMOS circuit having a combination of an n-channel TFT 613 and a p-channel TFT 614.

These TFTs (including 611, 613 and 614) may be fabricated in the same manner as the n-channel TFT of Embodiment 1 and the p-channel TFT of Embodiment 1. Though only the current supply TFT for an organic light emitting element (the current control TFT 611) is shown in FIG. 8, it goes without saying that it is not limited thereof, various circuits formed from plural TFTs may be provided at the end of the gate electrode of TFT.

The pixel electrode 612 functions as an anode of the organic light emitting element (OLED). Inorganic insulators 615 are formed at opposite ends of the pixel electrode 612, and an organic compound layer 616 and a cathode 617 of the light emitting element are formed over the pixel electrode 612.

The cathode 617 also functions as a common wiring element connected to all the pixels and is electrically connected to a FPC 609 via connection wiring 608. All the elements included in the pixel portion 602 and the gate-side drive circuit 603 are covered with a protective film 619. Although it is not shown in figure here, it is preferable that a buffer layer is provided before the formation of the protective film 619 as described in Embodiment Mode 2. In this embodiment, a silicon oxide film which becomes a buffer layer and a silicon nitride film which becomes a protective film are sequentially formed by sputtering on the cathode 617 made form a transparent conductive film.

A cover member 620 is bonded to the element layer by an adhesive. Further, color filters 621 corresponding to the respective pixels are provided in the cover member 620 in order to increase color purity. By providing the color filters 621, it is not necessary to provide a circular polarizing plate. Further, a desiccant may be set in the cover member 620.

In FIG. 8, the pixel electrode used as the anode while the organic compound layer and the cathode are formed in lamination, so that the light is emitted in the direction shown by the arrow in FIG. 8.

While the top gate TFTs have been described by way of example, the present invention can be applied irrespective of the TFT structure. For example, the present invention can be applied to bottom gate (inversely staggered structure) TFTs and staggered structure TFTs.

This embodiment may be freely combined with any one of Embodiment Modes 1 to 2, and Embodiment 1.

Embodiment 3

By implementing the present invention, EL modules (active matrix EL module and passive EC module) can be completed. Namely, by implementing the present invention, all of the electronic equipments into which the various modules are built are completed.

Following can be given as such electronic equipments: video cameras; digital cameras; head mounted displays (goggle type displays); car navigation systems; car stereos; personal computers; portable information terminals (mobile computers, mobile phones, electronic books etc.) etc. Examples of these are shown in FIGS. 9A to 9F and 10A to 10C.

FIG. 9A is a personal computer which comprises: a main body 2001; an image input section 2002; a display section 2003; and a keyboard 2004 etc.

FIG. 9B is a video camera which comprises: a main body 2101; a display section 2102; a voice input section 2103; operation switches 2104; a battery 2105 and an image receiving section 2106 etc.

FIG. 9C is a mobile computer which comprises: a main body 2201; a camera section 2202; an image receiving section 2203; operation switches 2204 and a display section 2205 etc.

FIG. 9D is a goggle type display which comprises: a main body 2301; a display section 2302; and an arm section 2303 etc.

FIG. 9E is a player using a recording medium in which a program is recorded (hereinafter referred to as a recording medium) which comprises: a main body 2401; a display section 2402; a speaker section 2403; a recording medium 2404; and operation switches 2405 etc. This apparatus uses DVD (digital versatile disc), CD, etc. for the recording medium, and can perform music appreciation, film appreciation, games and use for Internet.

FIG. 9F is a digital camera which comprises: a main body 2501; a display section 2502; a view finder 2503; operation switches 2504; and an image receiving section (not shown in the figure) etc.

Figure 10A:
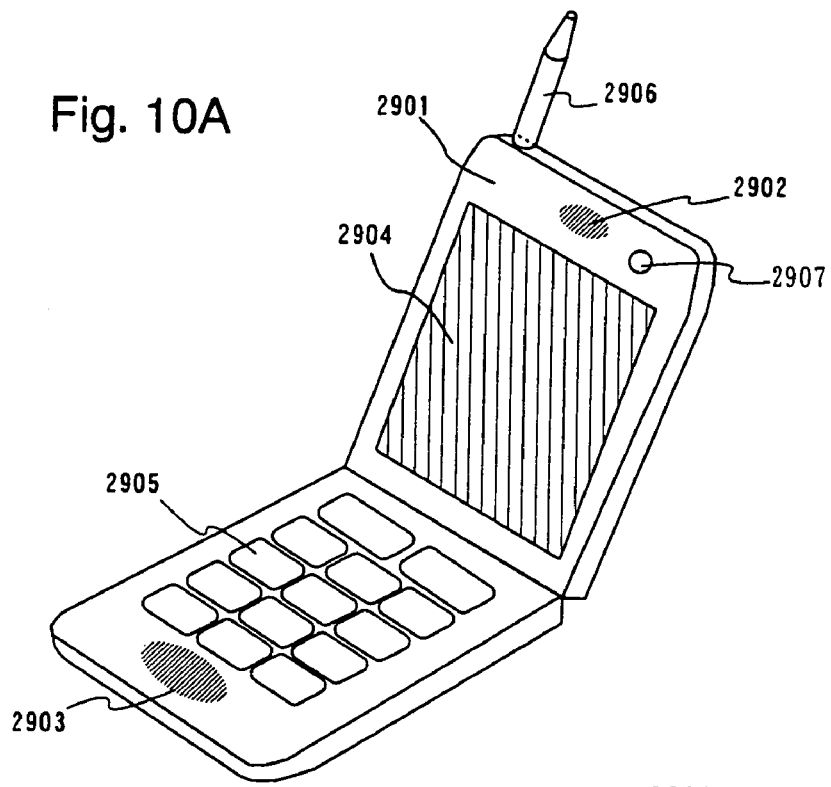
FIGS. 10A to 10C are diagrams showing examples of electronic equipment.

FIG. 10A is a mobile phone which comprises: a main body 2901; a voice output section 2902; a voice input section 2903; a display portion 2904; operation switches 2905; an antenna 2906; and an image input section (CCD, image sensor, etc.) 2907 etc.

Figure 10B:
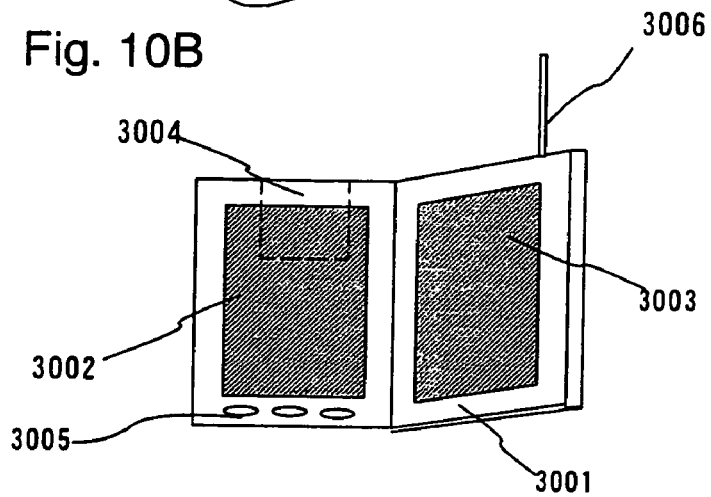

FIG. 10B is a portable book (electronic book) which comprises: a main body 3001; display portions 3002 and 3003; a recording medium 3004; operation switches 3005 and an antenna 3006 etc.

Figure 10C:
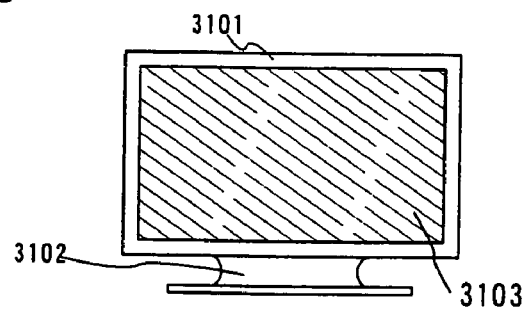

FIG. 10C is a display which comprises: a main body 3101; a supporting section 3102; and a display portion 3103 etc.

In addition, the display shown in FIG. 10C has small and medium-sized or large-sized screen, for example a size of 5 to 20 inches. Further, to manufacture the display part with such sizes, it is preferable to mass-produce by executing a multiple pattern using a substrate sized 1×1 m.

As described above, the applicable range of the present invention is extremely large, and the invention can be applied to electronic equipments of various areas. Note that the electronic devices of this embodiment can be achieved by utilizing any combination of constitutions in Embodiment Modes 1 to 2, and Embodiments 1 to 2.

Extremely high cost circularly polarizing plates become unnecessary in accordance with the present invention, and therefore manufacturing costs can be reduced.

Further, high definition, a high aperture ratio, and high reliability can be achieved for a full color flat panel display using red, green, and blue color emission light.

What is claimed is:

1. A portable information terminal comprising:
   a main body;
   a display portion; and
   at least one light emitting element comprising:
   a first light emitting region, the first light emitting region comprising a first organic compound layer between a cathode and an anode;
   a second light emitting region adjacent to the first light emitting region, the second light emitting region comprising the first organic compound layer and a second organic compound layer overlapped with the first organic compound layer between the cathode and the anode.

2. A portable information terminal according to claim 1, wherein a light emitting element adjacent to the at least one light emitting element has the second light emitting layer, and
   wherein color of the light emission of the second light emitting layer is different from that of the first light emitting layer.

3. A portable information terminal according to claim 1, further comprising color filters corresponding to each pixel.

4. A portable information terminal according to claim 1, wherein the portable information terminal is selected from the group consisting of a mobile computer, a mobile phone and an electronic book.

5. A portable information terminal comprising:
   a main body;
   a display portion;
   a first light emitting element, the first light emitting element comprising a first organic compound layer between a first electrode and a second electrode;
   a second light emitting element, the second light emitting element comprising a second organic compound layer between the first electrode and the second electrode; and
   a third light emitting element, the third light emitting element comprising a third organic compound layer between the first electrode and the second electrode,
   wherein the first organic compound layer overlaps a part of the second organic compound layer in the first light emitting element.

6. A portable information terminal according to claim 5, wherein the first light emitting element emits light of one color selected from the group consisting of red, green, and blue.

7. A portable information terminal according to claim 5, wherein the first light emitting element, the second light emitting element, and the third light emitting element each emit light having a mutually different color.

8. A portable information terminal according to claim 5, further comprising color filters corresponding to each pixel.

9. A portable information terminal according to claim 5, wherein the portable information terminal is selected from the group consisting of a mobile computer, a mobile phone and an electronic book.

10. A portable information terminal comprising:
    a main body;
    a display portion;
    a first light emitting element, the first light emitting element comprising a first organic compound layer between a first electrode and a second electrode;
    a second light emitting element, the second light emitting element comprising a second organic compound layer between the first electrode and the second electrode; and
    a third light emitting element, the third light emitting element comprising a third organic compound layer between the first electrode and the second electrode,
    wherein the first organic compound layer overlaps a part of the second organic compound layer in the first light emitting element, and
    wherein the second organic compound layer overlaps a part of the third organic compound layer in the second light emitting element.

11. A portable information terminal according to claim 10, wherein the first light emitting element emits light of one color selected from the group consisting of red, green, and blue.

12. A portable information terminal according to claim 10, wherein the first light emitting element, the second light emitting element, and the third light emitting element each emit light having a mutually different color.

13. A portable information terminal according to claim 10, further comprising color filters corresponding to each pixel.

14. A portable information terminal according to claim 10, wherein the portable information terminal is selected from the group consisting of a mobile computer, a mobile phone and an electronic book.

* * * * *